US012680964B2

(12) United States Patent
Barak et al.

(10) Patent No.: US 12,680,964 B2
(45) Date of Patent: Jul. 14, 2026

(54) TIME-DOMAIN OPTICAL METROLOGY AND INSPECTION OF SEMICONDUCTOR DEVICES

(71) Applicant: NOVA LTD., Rehovot (IL)

(72) Inventors: Gilad Barak, Rehovot (IL); Amir Sagiv, Rehovot (IL); Yishai Schreiber, Rehovot (IL); Jacob Ofek, Rehovot (IL); Zvi Gorohovsky, Rehovot (IL); Daphna Peimer, Rehovot (IL)

(73) Assignee: NOVA LTD., Rehovot (IL)

( * ) Notice: Subject to any disclaimer, the term of this patent is extended or adjusted under 35 U.S.C. 154(b) by 272 days.

(21) Appl. No.: 18/263,305

(22) PCT Filed: Jan. 28, 2022

(86) PCT No.: PCT/IB2022/050774
§ 371 (c)(1),
(2) Date: Jul. 27, 2023

(87) PCT Pub. No.: WO2022/162617
PCT Pub. Date: Aug. 4, 2022

(65) Prior Publication Data
US 2024/0085805 A1 Mar. 14, 2024

Related U.S. Application Data

(60) Provisional application No. 63/199,884, filed on Jan. 29, 2021, provisional application No. 63/142,971, filed on Jan. 28, 2021.

(51) Int. Cl.
| | | |
|---|---|---|
| *G01N 21/95* | (2006.01) | |
| *G01N 21/956* | (2006.01) | |
| (Continued) | | |

(52) U.S. Cl.
CPC ... *G01N 21/9501* (2013.01); *G01N 21/95607* (2013.01); *G03F 7/70625* (2013.01);
(Continued)

(58) Field of Classification Search
CPC .............. G03F 7/7065; G03F 7/70625; G03F 7/706831; G03F 7/706833;
(Continued)

(56) References Cited

U.S. PATENT DOCUMENTS

| | | |
|---|---|---|
| 6,771,372 B1 | 8/2004 | Traber |
| 10,274,435 B2 * | 4/2019 | Levant ............... G01B 11/0625 |
| | (Continued) | |

FOREIGN PATENT DOCUMENTS

| | | | | |
|---|---|---|---|---|
| WO | WO-2016164372 A1 * | 10/2016 | ......... | G03F 7/70525 |
| WO | 2020021411 A1 | 1/2020 | | |

*Primary Examiner* — Tarifur R Chowdhury
(74) *Attorney, Agent, or Firm* — Reches Patents

(57) ABSTRACT

A semiconductor device metrology including creating a time-domain representation of wavelength-domain measurement data of light reflected by a patterned structure of a semiconductor device, selecting a relevant and irrelevant portion of the time-domain representation, and determining one or more measurements of one or more parameters of interest of the patterned structure by performing model-based processing using the relevant portion of the time-domain representation.

13 Claims, 16 Drawing Sheets

(51) Int. Cl.
    *G03F 7/00*         (2006.01)
    *H10P 74/20*       (2026.01)

(52) U.S. Cl.
    CPC ...... *G03F 7/7065* (2013.01); *G03F 7/706831*
         (2023.05); *G03F 7/706833* (2023.05); *G03F*
         *7/706841* (2023.05); *H10P 74/203* (2026.01)

(58) Field of Classification Search
    CPC ........ G03F 7/706841; G01N 21/95607; G01N
         21/9501; G01N 21/956; H01L 22/12;
         G01B 2210/56; G01B 11/02
    See application file for complete search history.

(56)                  References Cited

U.S. PATENT DOCUMENTS

| | | | |
|---|---|---|---|
| 10,876,959 B2 * | 12/2020 | Shafir | .................... G01N 21/21 |
| 2006/0009872 A1 | 1/2006 | Prager et al. | |
| 2007/0091317 A1 | 4/2007 | Freischlad et al. | |
| 2015/0176985 A1 | 6/2015 | Shchegrov et al. | |

* cited by examiner

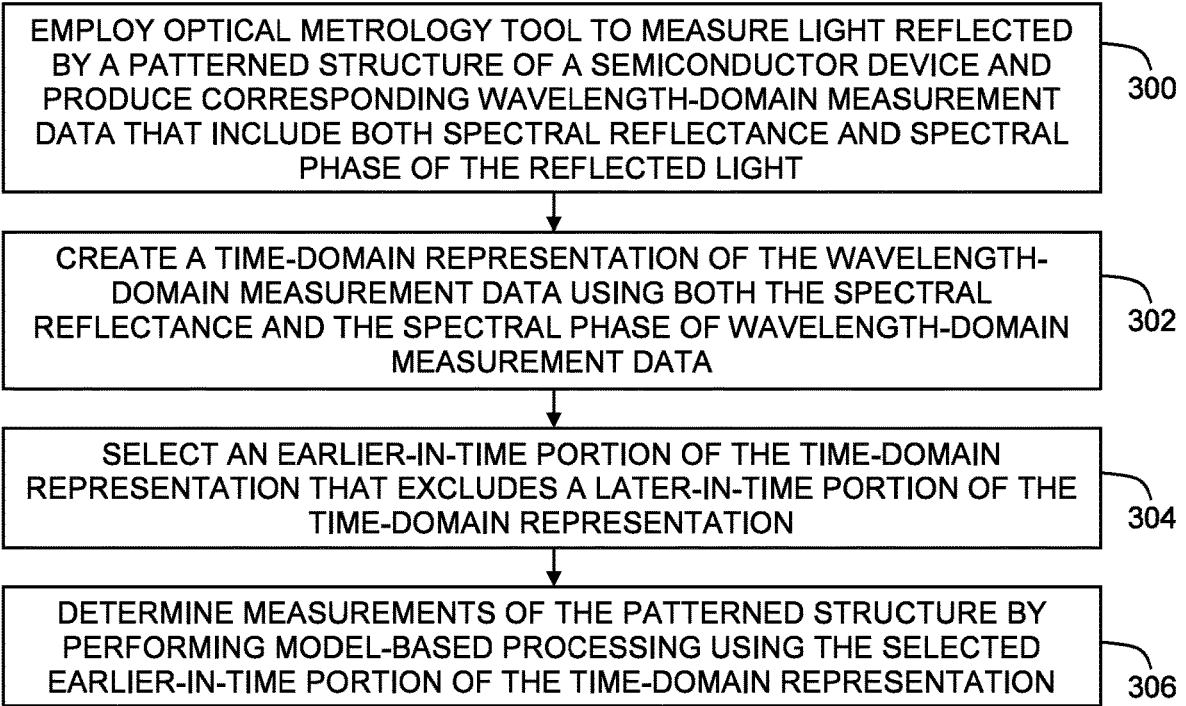

EMPLOY OPTICAL METROLOGY TOOL TO MEASURE LIGHT REFLECTED BY A PATTERNED STRUCTURE OF A SEMICONDUCTOR DEVICE AND PRODUCE CORRESPONDING WAVELENGTH-DOMAIN MEASUREMENT DATA THAT INCLUDE BOTH SPECTRAL REFLECTANCE AND SPECTRAL PHASE OF THE REFLECTED LIGHT — 300

CREATE A TIME-DOMAIN REPRESENTATION OF THE WAVELENGTH-DOMAIN MEASUREMENT DATA USING BOTH THE SPECTRAL REFLECTANCE AND THE SPECTRAL PHASE OF WAVELENGTH-DOMAIN MEASUREMENT DATA — 302

SELECT AN EARLIER-IN-TIME PORTION OF THE TIME-DOMAIN REPRESENTATION THAT EXCLUDES A LATER-IN-TIME PORTION OF THE TIME-DOMAIN REPRESENTATION — 304

DETERMINE MEASUREMENTS OF THE PATTERNED STRUCTURE BY PERFORMING MODEL-BASED PROCESSING USING THE SELECTED EARLIER-IN-TIME PORTION OF THE TIME-DOMAIN REPRESENTATION — 306

Fig. 3A

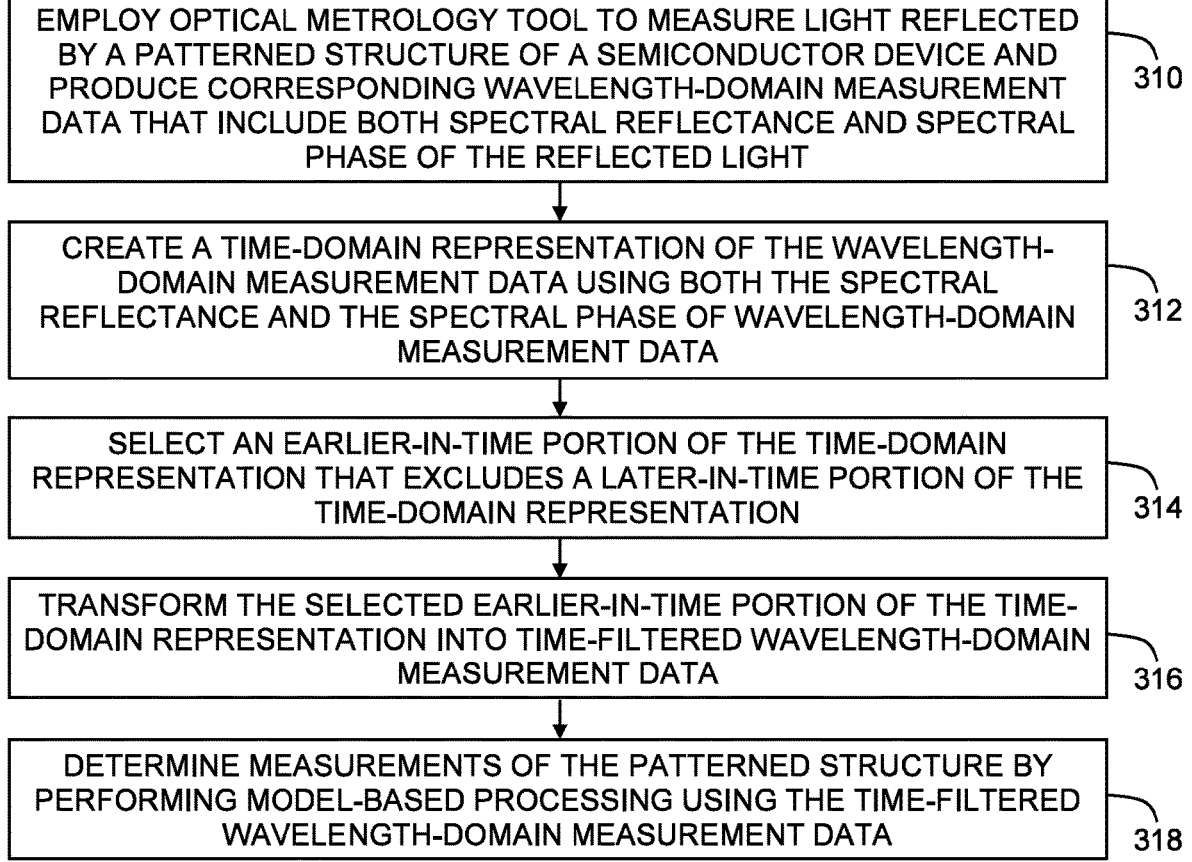

EMPLOY OPTICAL METROLOGY TOOL TO MEASURE LIGHT REFLECTED BY A PATTERNED STRUCTURE OF A SEMICONDUCTOR DEVICE AND PRODUCE CORRESPONDING WAVELENGTH-DOMAIN MEASUREMENT DATA THAT INCLUDE BOTH SPECTRAL REFLECTANCE AND SPECTRAL PHASE OF THE REFLECTED LIGHT — 310

CREATE A TIME-DOMAIN REPRESENTATION OF THE WAVELENGTH-DOMAIN MEASUREMENT DATA USING BOTH THE SPECTRAL REFLECTANCE AND THE SPECTRAL PHASE OF WAVELENGTH-DOMAIN MEASUREMENT DATA — 312

SELECT AN EARLIER-IN-TIME PORTION OF THE TIME-DOMAIN REPRESENTATION THAT EXCLUDES A LATER-IN-TIME PORTION OF THE TIME-DOMAIN REPRESENTATION — 314

TRANSFORM THE SELECTED EARLIER-IN-TIME PORTION OF THE TIME-DOMAIN REPRESENTATION INTO TIME-FILTERED WAVELENGTH-DOMAIN MEASUREMENT DATA — 316

DETERMINE MEASUREMENTS OF THE PATTERNED STRUCTURE BY PERFORMING MODEL-BASED PROCESSING USING THE TIME-FILTERED WAVELENGTH-DOMAIN MEASUREMENT DATA — 318

Fig. 3B

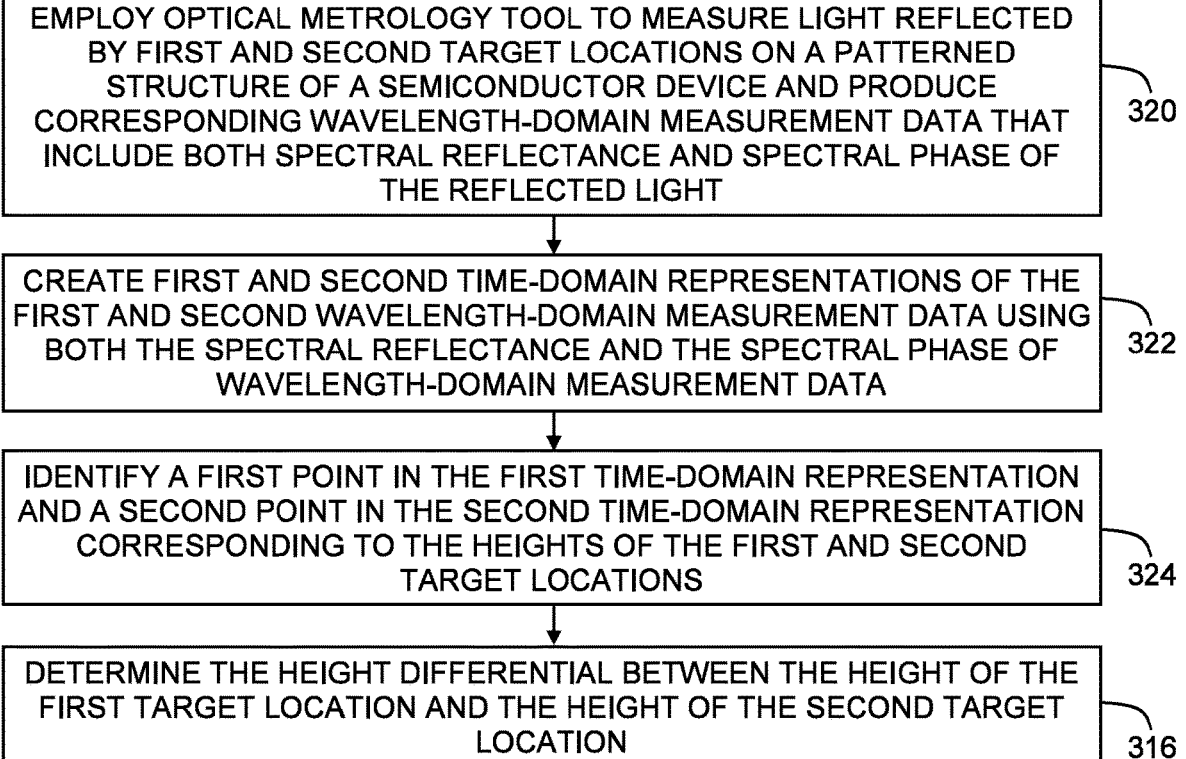

EMPLOY OPTICAL METROLOGY TOOL TO MEASURE LIGHT REFLECTED BY FIRST AND SECOND TARGET LOCATIONS ON A PATTERNED STRUCTURE OF A SEMICONDUCTOR DEVICE AND PRODUCE CORRESPONDING WAVELENGTH-DOMAIN MEASUREMENT DATA THAT INCLUDE BOTH SPECTRAL REFLECTANCE AND SPECTRAL PHASE OF THE REFLECTED LIGHT — 320

CREATE FIRST AND SECOND TIME-DOMAIN REPRESENTATIONS OF THE FIRST AND SECOND WAVELENGTH-DOMAIN MEASUREMENT DATA USING BOTH THE SPECTRAL REFLECTANCE AND THE SPECTRAL PHASE OF WAVELENGTH-DOMAIN MEASUREMENT DATA — 322

IDENTIFY A FIRST POINT IN THE FIRST TIME-DOMAIN REPRESENTATION AND A SECOND POINT IN THE SECOND TIME-DOMAIN REPRESENTATION CORRESPONDING TO THE HEIGHTS OF THE FIRST AND SECOND TARGET LOCATIONS — 324

DETERMINE THE HEIGHT DIFFERENTIAL BETWEEN THE HEIGHT OF THE FIRST TARGET LOCATION AND THE HEIGHT OF THE SECOND TARGET LOCATION — 316

Fig. 3C

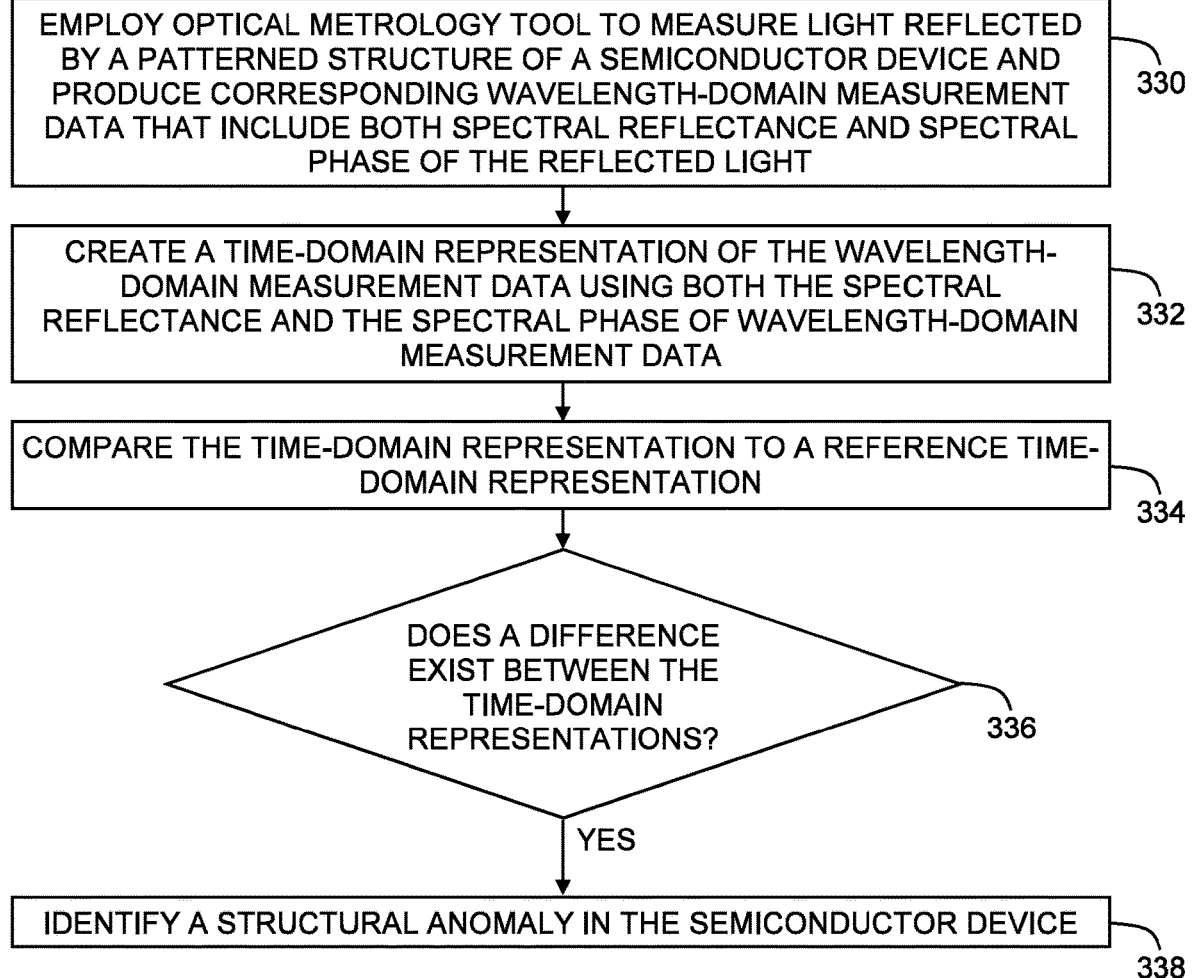

EMPLOY OPTICAL METROLOGY TOOL TO MEASURE LIGHT REFLECTED BY A PATTERNED STRUCTURE OF A SEMICONDUCTOR DEVICE AND PRODUCE CORRESPONDING WAVELENGTH-DOMAIN MEASUREMENT DATA THAT INCLUDE BOTH SPECTRAL REFLECTANCE AND SPECTRAL PHASE OF THE REFLECTED LIGHT     330

CREATE A TIME-DOMAIN REPRESENTATION OF THE WAVELENGTH-DOMAIN MEASUREMENT DATA USING BOTH THE SPECTRAL REFLECTANCE AND THE SPECTRAL PHASE OF WAVELENGTH-DOMAIN MEASUREMENT DATA     332

COMPARE THE TIME-DOMAIN REPRESENTATION TO A REFERENCE TIME-DOMAIN REPRESENTATION     334

DOES A DIFFERENCE EXIST BETWEEN THE TIME-DOMAIN REPRESENTATIONS?     336

YES

IDENTIFY A STRUCTURAL ANOMALY IN THE SEMICONDUCTOR DEVICE     338

Fig. 3D

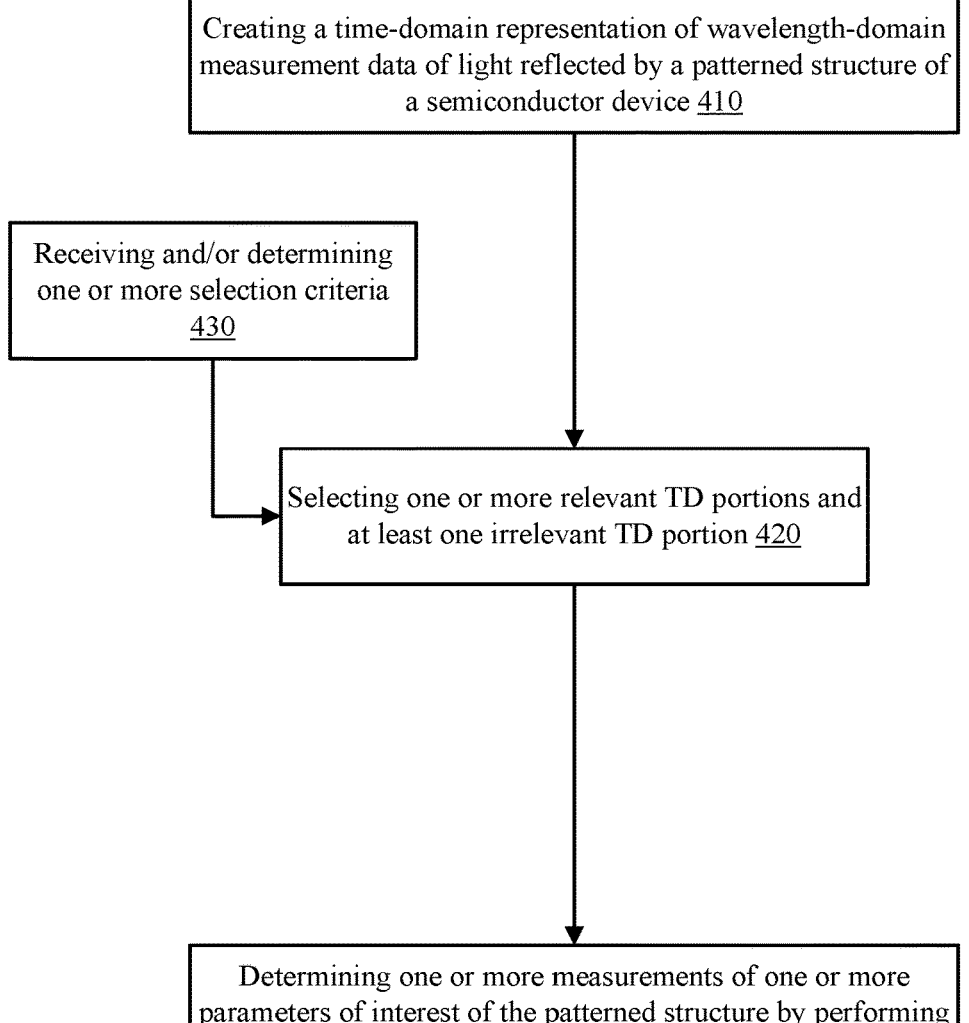

Creating a time-domain representation of wavelength-domain measurement data of light reflected by a patterned structure of a semiconductor device 410

Receiving and/or determining one or more selection criteria 430

Selecting one or more relevant TD portions and at least one irrelevant TD portion 420

Determining one or more measurements of one or more parameters of interest of the patterned structure by performing processing using the one or more relevant TD portions 490

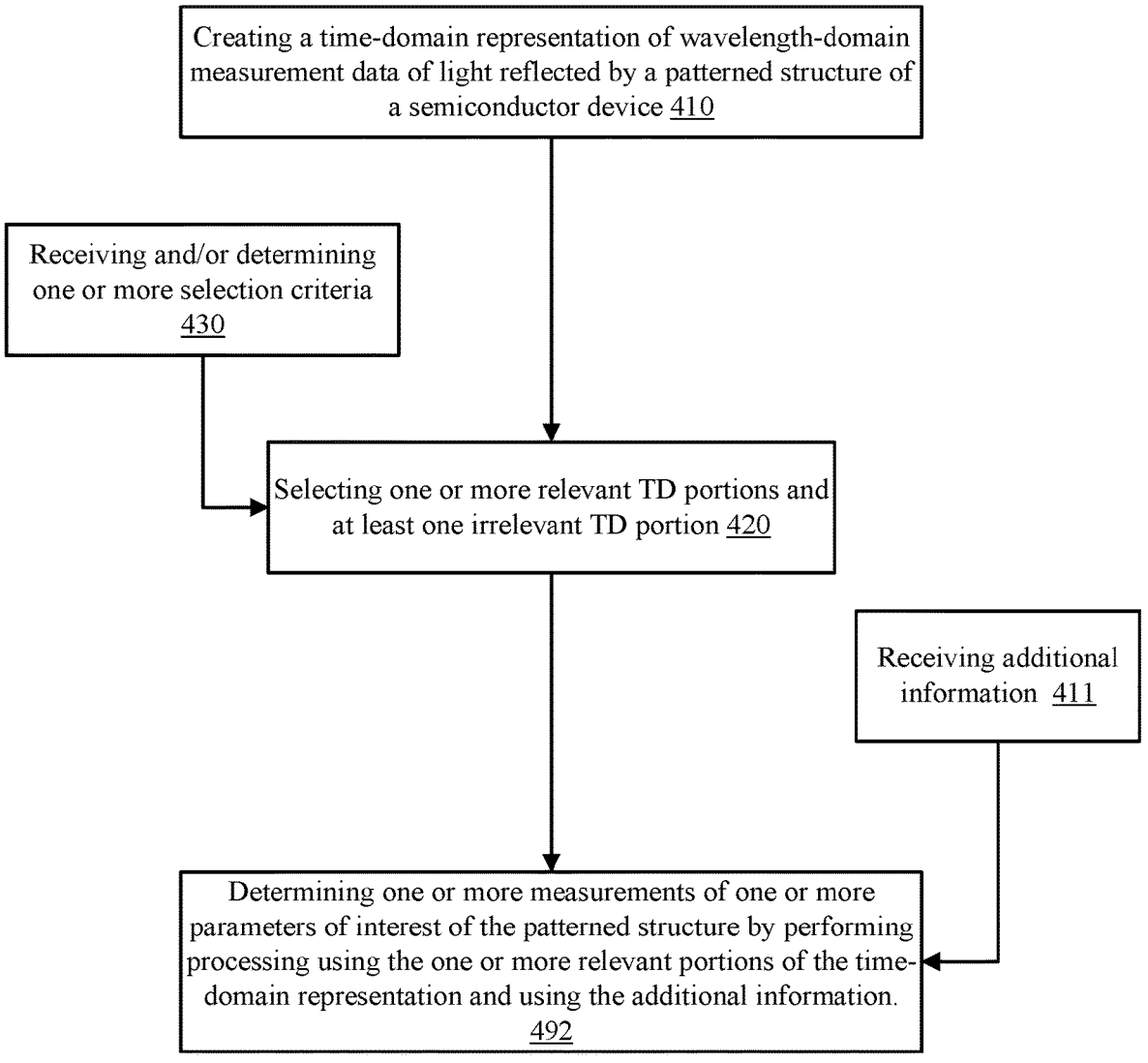

Creating a time-domain representation of wavelength-domain measurement data of light reflected by a patterned structure of a semiconductor device 410

Receiving and/or determining one or more selection criteria 430

Selecting one or more relevant TD portions and at least one irrelevant TD portion 420

Receiving additional information 411

Determining one or more measurements of one or more parameters of interest of the patterned structure by performing processing using the one or more relevant portions of the time-domain representation and using the additional information. 492

Figure 4C:
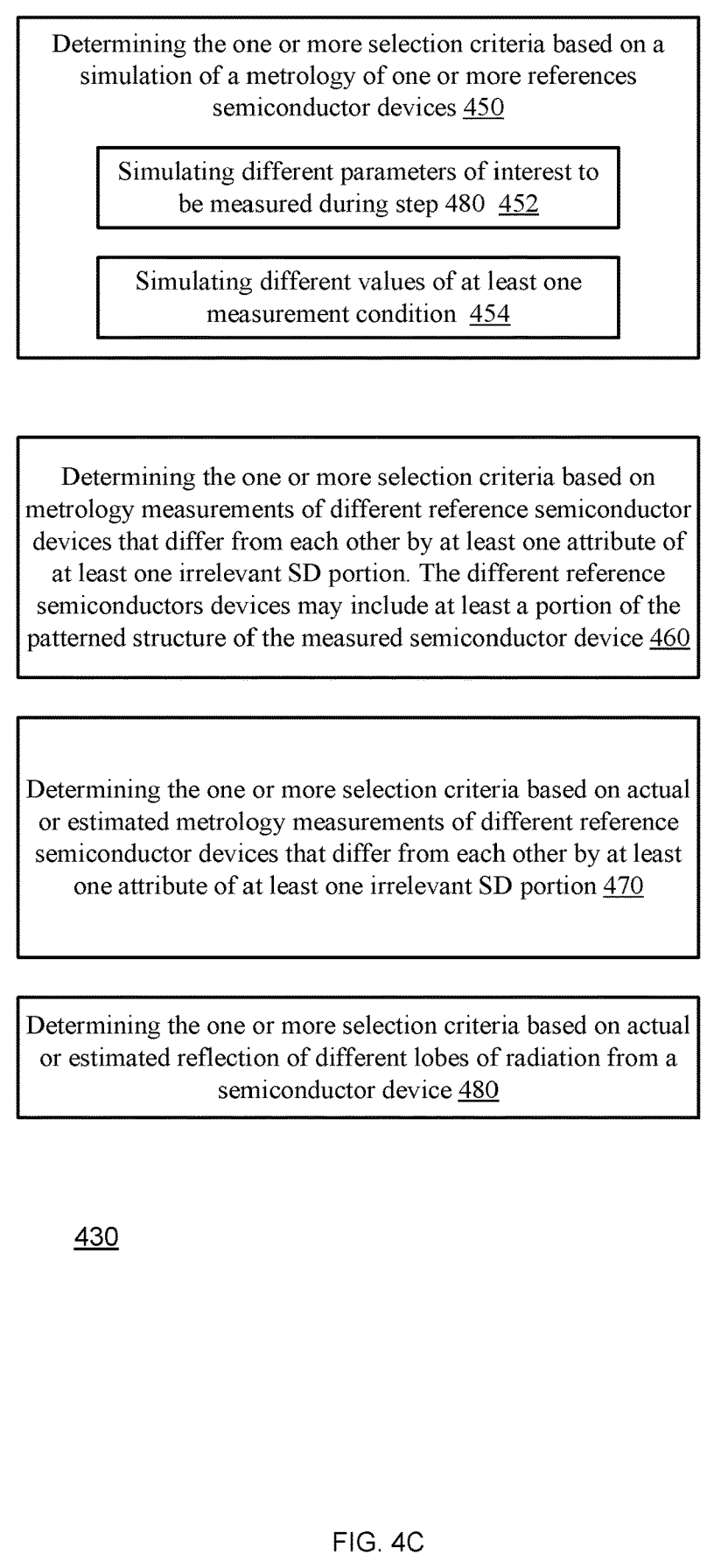

Determining the one or more selection criteria based on a simulation of a metrology of one or more references semiconductor devices 450

Simulating different parameters of interest to be measured during step 480 452

Simulating different values of at least one measurement condition 454

Determining the one or more selection criteria based on metrology measurements of different reference semiconductor devices that differ from each other by at least one attribute of at least one irrelevant SD portion. The different reference semiconductors devices may include at least a portion of the patterned structure of the measured semiconductor device 460

Determining the one or more selection criteria based on actual or estimated metrology measurements of different reference semiconductor devices that differ from each other by at least one attribute of at least one irrelevant SD portion 470

Determining the one or more selection criteria based on actual or estimated reflection of different lobes of radiation from a semiconductor device 480

Figure 5:
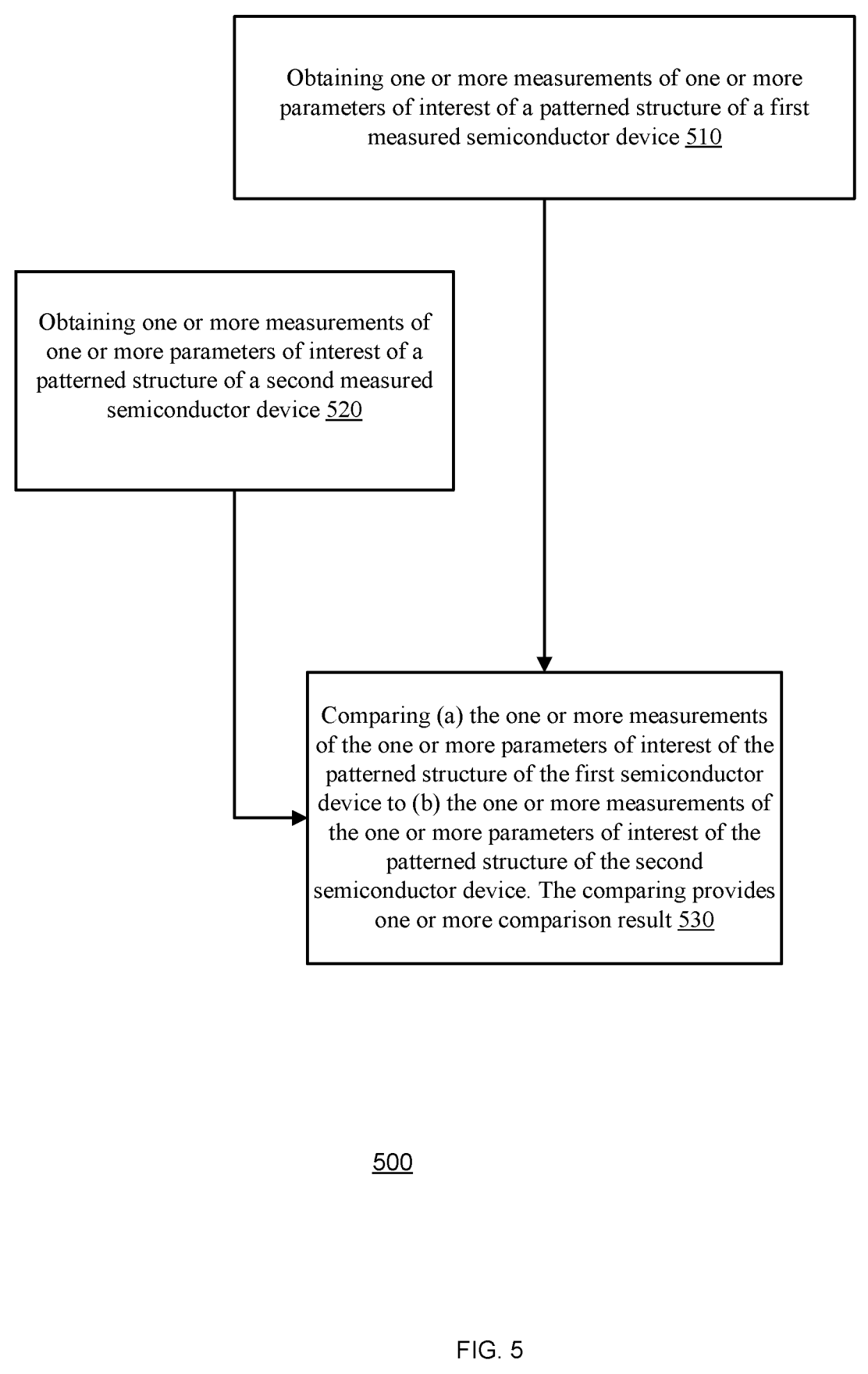

Obtaining one or more measurements of one or more parameters of interest of a patterned structure of a first measured semiconductor device 510

Obtaining one or more measurements of one or more parameters of interest of a patterned structure of a second measured semiconductor device 520

Comparing (a) the one or more measurements of the one or more parameters of interest of the patterned structure of the first semiconductor device to (b) the one or more measurements of the one or more parameters of interest of the patterned structure of the second semiconductor device. The comparing provides one or more comparison result 530

TIME-DOMAIN OPTICAL METROLOGY AND INSPECTION OF SEMICONDUCTOR DEVICES

CROSS REFERENCE

This application claims priority from U.S. provisional patent Ser. No. 63/142,971 filing date Jan. 28, 2021 and U.S. provisional patent Ser. No. 63/199,884 filing date Jan. 29, 2021—both being incorporated herein by reference in their entirety.

BACKGROUND

Semiconductor devices, such as logic and memory devices, are typically fabricated by depositing a series of layers on a semiconductor wafer, where some or all of the layers include patterned structures. Optical scatterometry is often used to characterize properties of semiconductor devices by measuring light reflected by the various layers of a semiconductor device, and then interpreting the measured light spectra with respect to predefined models or other reference data. Optical scatterometry is particularly suited for use with semiconductor devices having only periodic patterned structures, such as is commonly the case with memory devices. However, some types of semiconductor devices have upper layers with periodic patterned structures, such as of memory circuitry, as well as lower layers with aperiodic structures, such as of logic circuitry, making it difficult or impossible to characterize properties of such devices using existing optical scatterometry techniques.

SUMMARY

There are provided systems, method and non-transitory computer readable medium for time-domain optical metrology and inspection of semiconductor devices.

BRIEF DESCRIPTION OF THE DRAWINGS

Aspects, will be understood and appreciated more fully from the following detailed description taken in conjunction with the appended drawings in which:

FIGS. 3A-3D are simplified flowchart illustrations of exemplary methods of operation of the systems of FIGS. 1A-1D.

FIG. 4A illustrates an example of a method;

FIG. 4B illustrates an example of a method;

FIG. 4C illustrates an example of a step of the method of FIG. 4A;

FIG. 5 illustrates an example of a method; and

DETAILED DESCRIPTION

Figure 1A:
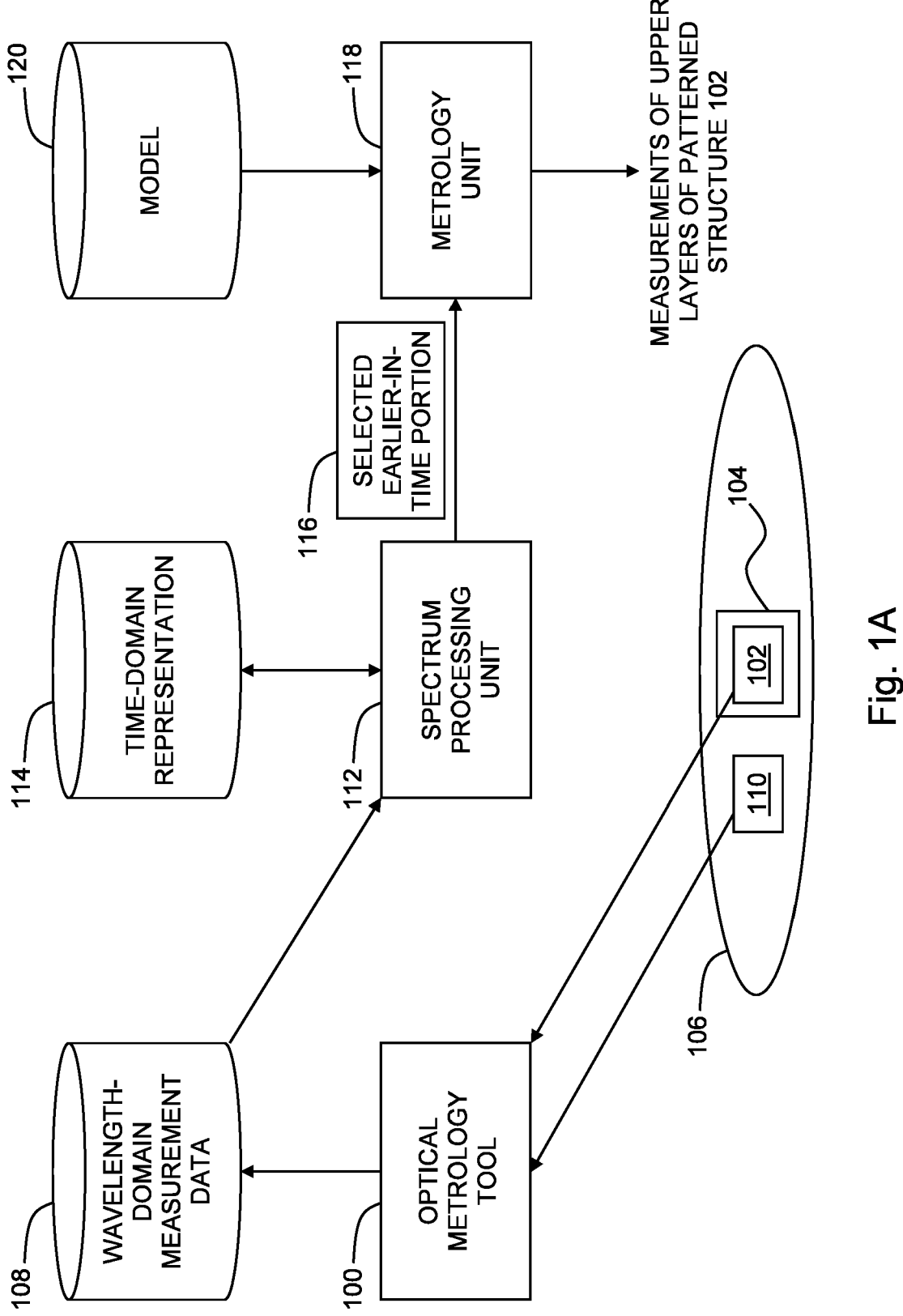
FIGS. 1A-1D, taken together, is a simplified conceptual illustration of a system for time-domain optical metrology and inspection of semiconductor devices, constructed and operative in accordance with an embodiment of the invention.

In one aspect, a method is provided for semiconductor device metrology, the method including creating a time-domain representation of wavelength-domain measurement data of light reflected by a patterned structure of a semiconductor device, selecting an earlier-in-time portion of the time-domain representation that excludes a later-in-time portion of the time-domain representation, and determining one or more measurements of one or more parameters of interest of the patterned structure by performing model-based processing using the earlier-in-time portion of the time-domain representation.

In another aspect, the predefined model is configured for determining time-domain representations of theoretical wavelength-domain measurement data of light expected to be reflected by the patterned structure for corresponding theoretical measurements of the patterned structure.

In another aspect, the predefined model models one or more upper layers of the patterned structure corresponding to the earlier-in-time portion of the time-domain representation.

In another aspect, the predefined model models the one or more upper layers of the patterned structure excluding all other layers of the patterned structure.

In another aspect, the wavelength-domain measurement data include spectral amplitude and spectral phase, and where the creating includes creating the time-domain representation using both the spectral amplitude and the spectral phase.

In another aspect, a method is provided for semiconductor device metrology, the method including creating a time-domain representation of wavelength-domain measurement data of light reflected by a patterned structure of a semiconductor device, selecting an earlier-in-time portion of the time-domain representation that excludes a later-in-time portion of the time-domain representation, transforming the selected earlier-in-time portion of the time-domain representation into time-filtered wavelength-domain measurement data, and determining one or more measurements of one or more parameters of interest of the patterned structure by performing model-based processing using the time-filtered wavelength-domain measurement data.

In another aspect, the predefined model is configured for determining theoretical wavelength-domain measurement data of light expected to be reflected by the patterned structure for corresponding theoretical measurements of the patterned structure.

In another aspect, the predefined model models one or more upper layers of the patterned structure corresponding to the time-filtered wavelength-domain measurement data.

In another aspect, the predefined model models the one or more upper layers of the patterned structure excluding all other layers of the patterned structure.

In another aspect, the wavelength-domain measurement data include spectral amplitude and spectral phase, and where the creating includes creating the time-domain representation using both the spectral amplitude and the spectral phase.

In another aspect, a method is provided for semiconductor device metrology, the method including creating a first time-domain representation of first wavelength-domain measurement data of light reflected by a first target location on a patterned structure of a semiconductor device, creating a second time-domain representation of second wavelength-domain measurement data of light reflected by a second target.

location on the patterned structure of the semiconductor device, identifying a first point in the first time-domain representation corresponding to a height of the first target location, identifying a second point in the second time-domain representation corresponding to a height of the second target location, and determining a height differential between the height of the first target location and the height of the second target location.

In another aspect, the first wavelength-domain measurement data include spectral amplitude and spectral phase associated with the first target location, where the second wavelength-domain measurement data include spectral amplitude and spectral phase associated with the second target location, where the creating the first time-domain representation includes creating the first time-domain representation using both the spectral amplitude and the spectral phase of the first wavelength-domain measurement data, and where the creating the second time-domain representation includes creating the second time-domain representation using both the spectral amplitude and the spectral phase of the second wavelength-domain measurement data.

In another aspect, a method is provided for semiconductor device inspection, the method including creating a time-domain representation of wavelength-domain measurement data of light reflected by a patterned structure of a semiconductor device, comparing the time-domain representation to a reference time-domain representation of light reflected by a reference patterned structure, and identifying a structural anomaly in the semiconductor device if a difference exists between the time-domain representations.

In another aspect, the wavelength-domain measurement data include spectral amplitude and spectral phase, and where the creating includes creating the time-domain representation using both the spectral amplitude and the spectral phase.

In another aspect, a system is provided for semiconductor device metrology, the system including a spectrum processing unit configured to create a time-domain representation of wavelength-domain measurement data of light reflected by a patterned structure of a semiconductor device, and select an earlier-in-time portion of the time-domain representation that excludes a later-in-time portion of the time-domain representation, and a metrology unit configured to determine one or more measurements of one or more parameters of interest of the patterned structure by performing model-based processing using the earlier-in-time portion of the time-domain representation, where the spectrum processing unit and the metrology unit are implemented in any of a) computer hardware, and b) computer software embodied in a non-transitory, computer-readable medium.

In another aspect, the predefined model is configured for determining time-domain representations of theoretical wavelength-domain measurement data of light expected to be reflected by the patterned structure for corresponding theoretical measurements of the patterned structure.

In another aspect, the predefined model models one or more upper layers of the patterned structure corresponding to the earlier-in-time portion of the time-domain representation.

In another aspect, the predefined model models the one or more upper layers of the patterned structure excluding all other layers of the patterned structure.

In another aspect, the wavelength-domain measurement data include spectral amplitude and spectral phase, and where the spectrum processing unit is configured to create the time-domain representation using both the spectral amplitude and the spectral phase.

In another aspect, a system is provided for semiconductor device metrology, the system including a spectrum processing unit configured to create a time-domain representation of wavelength-domain measurement data of light reflected by a patterned structure of a semiconductor device, select an earlier-in-time portion of the time-domain representation that excludes a later-in-time portion of the time-domain representation, and transform the selected earlier-in-time portion of the time-domain representation into time-filtered wavelength-domain measurement data, and a metrology unit configured to determine one or more measurements of one or more parameters of interest of the patterned structure by performing model-based processing using the time-filtered wavelength-domain measurement data, where the spectrum processing unit and the metrology unit are implemented in any of a) computer hardware, and b) computer software embodied in a non-transitory, computer-readable medium.

In another aspect, the predefined model is configured for determining theoretical wavelength-domain measurement data of light expected to be reflected by the patterned structure for corresponding theoretical measurements of the patterned structure.

In another aspect, the predefined model models one or more upper layers of the patterned structure corresponding to the time-filtered wavelength-domain measurement data.

In another aspect, the predefined model models the one or more upper layers of the patterned structure excluding all other layers of the patterned structure.

In another aspect, the wavelength-domain measurement data include spectral amplitude and spectral phase, and where the spectrum processing unit is configured to create the time-domain representation using both the spectral amplitude and the spectral phase.

In another aspect, a system is provided for semiconductor device metrology, the system including a spectrum processing unit configured to create a first time-domain representation of first wavelength-domain measurement data of light reflected by a first target location on a patterned structure of a semiconductor device, and create a second time-domain representation of second wavelength-domain measurement data of light reflected by a second target location on the patterned structure of the semiconductor device, and a metrology unit configured to identify a first point in the first time-domain representation corresponding to a height of the first target location, identify a second point in the second time-domain representation corresponding to a height of the second target location, and determine a height differential between the height of the first target location and the height of the second target location, where the spectrum processing unit and the metrology unit are implemented in any of a) computer hardware, and b) computer software embodied in a non-transitory, computer-readable medium.

In another aspect, the first wavelength-domain measurement data include spectral amplitude and spectral phase associated with the first target location, where the second wavelength-domain measurement data include spectral amplitude and spectral phase associated with the second target location, where the spectrum processing unit is configured to create the first time-domain representation using both the spectral amplitude and the spectral phase of the wavelength-domain measurement data associated with the first target location, and where the spectrum processing unit is configured to create the second time-domain representation using both the spectral amplitude and the spectral phase of the wavelength-domain measurement data associated with the second target location.

In another aspect, a system is provided for semiconductor device inspection, the system including a spectrum processing unit configured to create a time-domain representation of wavelength-domain measurement data of light reflected by a patterned structure of a semiconductor device, and a structural anomaly detector configured to compare the time-domain representation to a reference time-domain representation of light reflected by a reference patterned structure, and identify a structural anomaly in the semiconductor device if a difference exists between the time-domain representations, where the spectrum processing unit and the structural anomaly detector are implemented in any of a) computer hardware, and b) computer software embodied in a non-transitory, computer-readable medium.

In another aspect, the wavelength-domain measurement data include spectral amplitude and spectral phase, and where the spectrum processing unit is configured to create the time-domain representation using both the spectral amplitude and the spectral phase.

Reference is now made to FIGS. 1A-1D which, taken together, is a simplified conceptual illustration of a system for time-domain optical metrology and inspection of semiconductor devices, constructed and operative in accordance with an embodiment of the invention. In the system of FIG. 1A, an optical metrology tool 100, such as PRIZM™, commercially available from Nova Measuring Instruments, Ltd. of Rehovot, Israel, or as is otherwise described in U.S. Pat. No. 10,161,885, is employed to measure, in accordance with conventional techniques, light reflected by a patterned structure 102 of a semiconductor device 104, such as on a semiconductor wafer 106, and produce corresponding wavelength-domain measurement data 108 that preferably include both spectral amplitude and spectral phase of the reflected light. Optical metrology tool 100 measures the light reflected by patterned structure 102 at any selected point during or after fabrication of patterned structure 102.

Figure 2A:
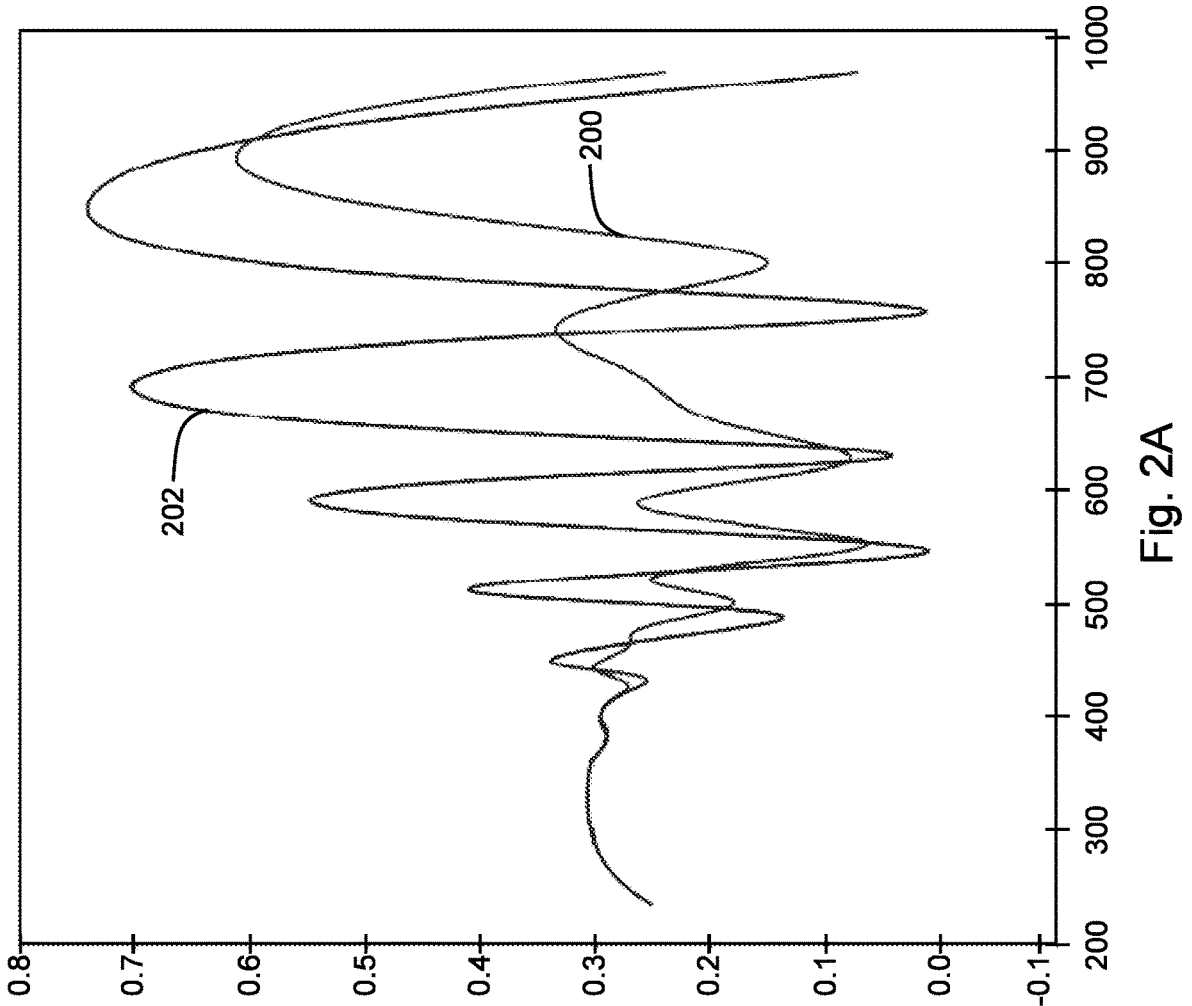
FIGS. 2A-2C are simplified graphical illustrations useful in understanding embodiments of the invention.

An example of wavelength-domain measurement data 108 is shown in FIG. 2A which shows a spectral reflectance graph 200, such as of patterned structure 102. A spectral reflectance graph 202 is also shown of a comparison patterned structure that acts as a reference to which patterned structure 102 is compared. The comparison patterned structure may be a "test" patterned structure 110 that is also located on semiconductor device 104, where spectral reflectance graph 202 is produced in the same manner as spectral reflectance graph 200. Although the graphs are substantially identical up to approximately 430 nm, they differ quite significantly thereafter.

Also shown in FIG. 1A is a spectrum processing unit 112, which is preferably integrated into optical metrology tool 100. Spectrum processing unit 112 is preferably configured to create a time-domain representation 114 of wavelength-domain measurement data 108 in accordance with conventional techniques, such as by using both the spectral amplitude and the spectral phase of wavelength-domain measurement data 108.

Figure 2B:
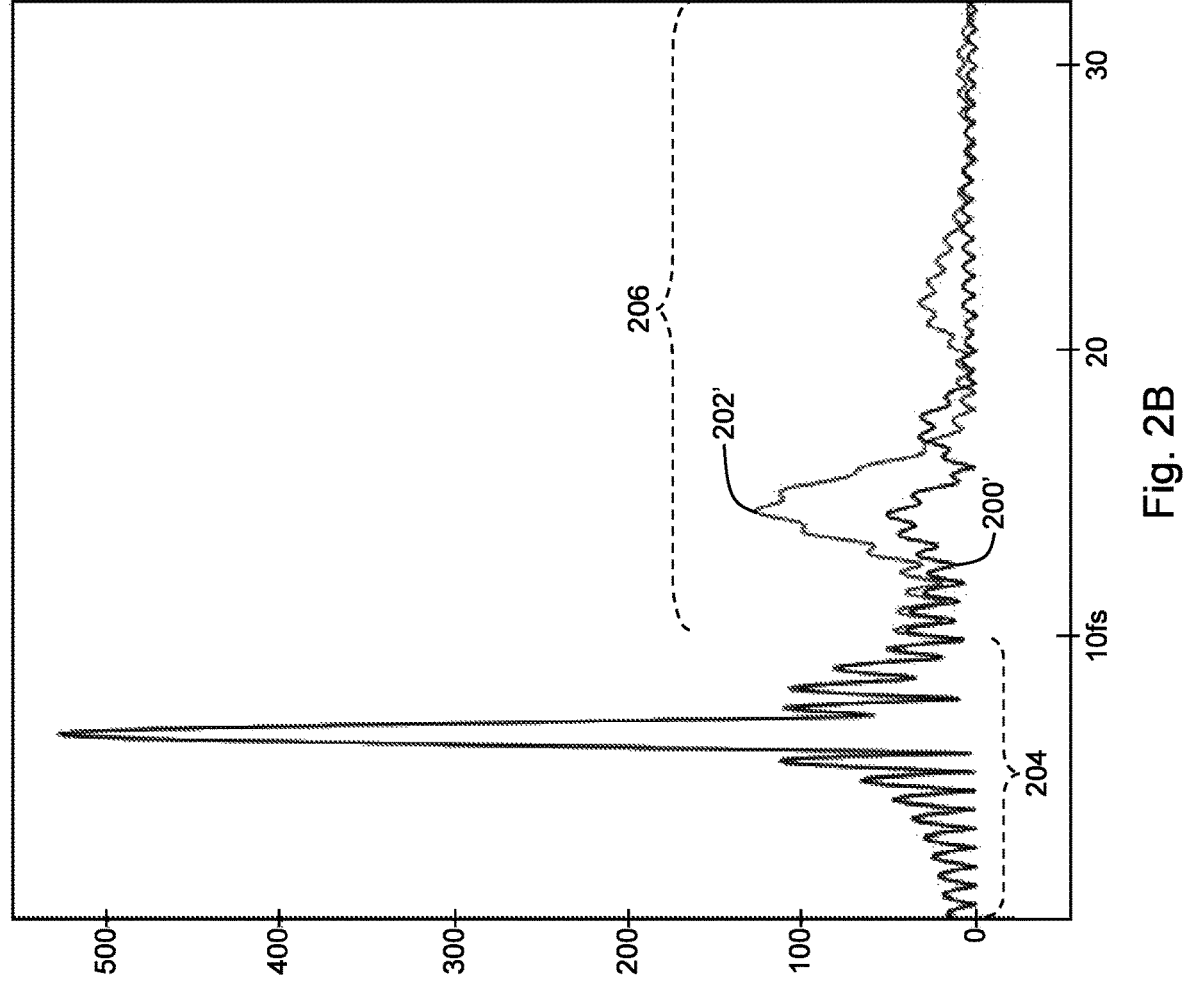

FIG. 2B shows a time-domain representation 200' of spectral reflectance graph 200, representing the time at which reflected light is received by optical metrology tool 100 after illuminating patterned structure 102. A time-domain representation 202' of spectral reflectance graph 202 is also shown for comparison. Here the graphs are substantially identical up to approximately 10 femtoseconds along the X axis (the Y axis representing signal amplitude in any known type of units in time domain), indicating that upper layers of patterned structure 102 and of test patterned structure 110, that reflect light sooner than lower layers, are likewise substantially identical.

Spectrum processing unit 112 of FIG. 1A is preferably configured to select an earlier-in-time portion 116 of time-domain representation 114 that excludes a later-in-time portion of time-domain representation 114. The selection may be indicated to spectrum processing unit 112 by a human operator, or may be performed automatically by spectrum processing unit 112 in accordance with predefined criteria, such as by selecting as earlier-in-time portion 116 the portion of time-domain representation 114 that includes only the first n femtoseconds of reflected light, where n may be any predefined value. Thus, for example, spectrum processing unit 112 may select an earlier-in-time portion 204 of time-domain representation 200' in FIG. 2B that excludes a later-in-time portion 206 of time-domain representation 200'.

Also shown in FIG. 1A is a metrology unit 118, which is preferably integrated into optical metrology tool 100. In one embodiment, metrology unit 118 is configured to determine one or more measurements of parameters of interest (e.g., OCD, SWA, height, etc.) of patterned structure 102 by performing model-based processing using the selected earlier-in-time portion 116 of time-domain representation 114 of wavelength-domain measurement data 108. In this embodiment a predefined model 120 is configured for determining time-domain representations of theoretical wavelength-domain measurement data of light expected to be reflected by patterned structure 102 for corresponding theoretical measurements of patterned structure 102. Predefined model 120 preferably models one or more upper layers of patterned structure 102 corresponding to the selected earlier-in-time portion 116 of time-domain representation 114, and predefined model 120 preferably excludes all other layers of patterned structure 102. The model-based processing preferably employs model fitting techniques, such as is commonly used in semiconductor metrology, using predefined model 120 to determine a set of theoretical measurements of patterned structure 102 that would result in a model-based time-domain representation of theoretical wavelength-domain measurement data of light expected to be reflected by patterned structure 102 given the set of theoretical measurements, and thereby actual determine measurements of patterned structure 102 where the model-based time-domain representation is substantially identical, within predefined tolerances, to selected earlier-in-time portion 116 of time-domain representation 114.

Figure 1B:
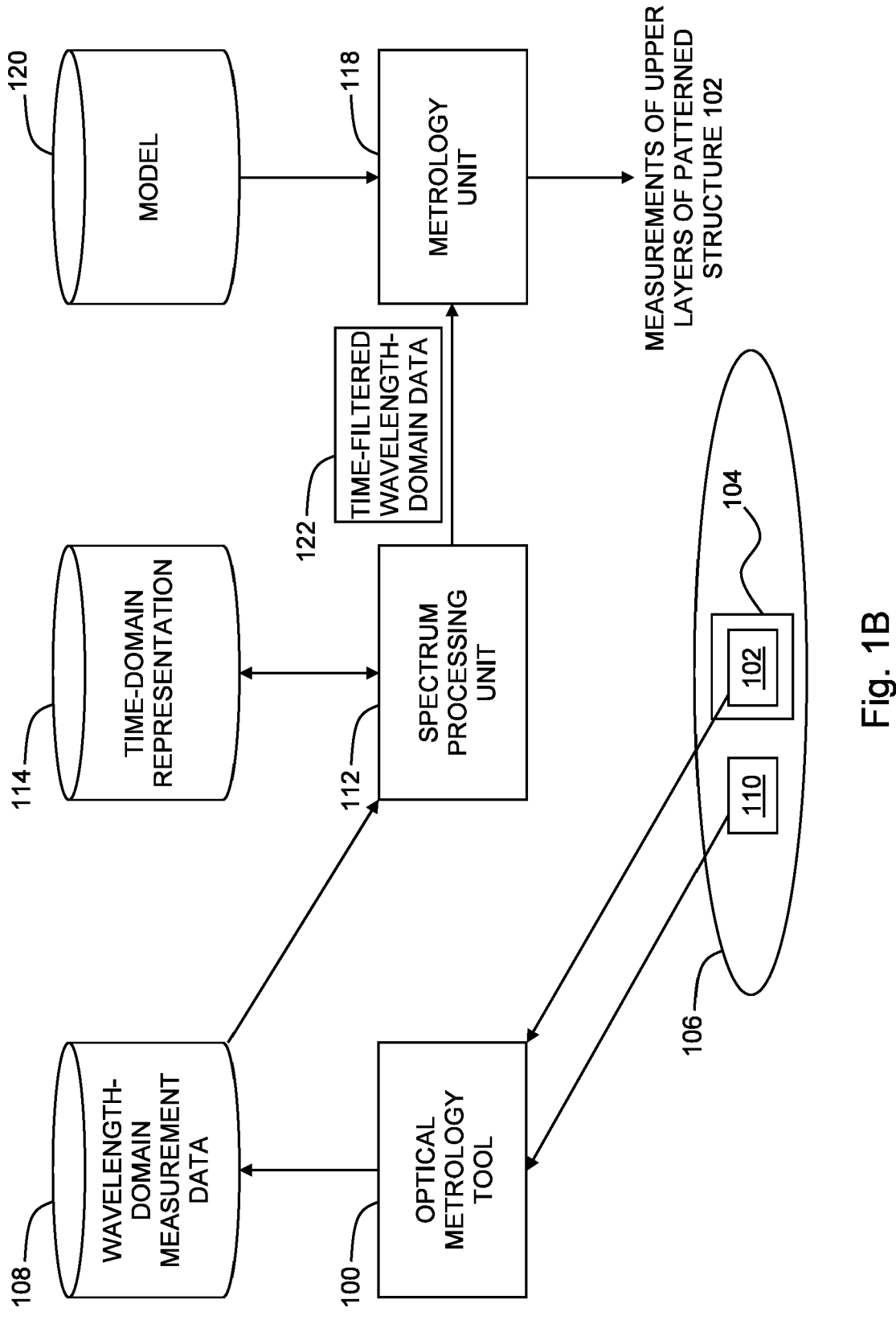

In another embodiment shown in FIG. 1B, spectrum processing unit 112 transforms selected earlier-in-time portion 116 of time-domain representation 114 into time-filtered wavelength-domain measurement data 122. Metrology unit 118 then determines one or more measurements of patterned structure 102 by performing model-based processing using the time-filtered wavelength-domain measurement data 122. In this embodiment predefined model 120 is configured for determining theoretical wavelength-domain measurement data of light expected to be reflected by patterned structure 102 for corresponding theoretical measurements of patterned structure 102. Predefined model 120 preferably models one or more upper layers of patterned structure 102 corresponding to time-filtered wavelength-domain measurement data 122, and predefined model 120 preferably excludes all other layers of patterned structure 102.

In another embodiment shown in FIG. 1C, optical metrology tool 100 is employed to measure light reflected by a first target location 124 on patterned structure 102 and produce corresponding wavelength-domain measurement data 126 as described hereinabove. Optical metrology tool 100 is then employed to measure light reflected by a second target location 128 on patterned structure 102 and produce corresponding wavelength-domain measurement data 130 as described hereinabove. An example of first target location

Figure 2C:
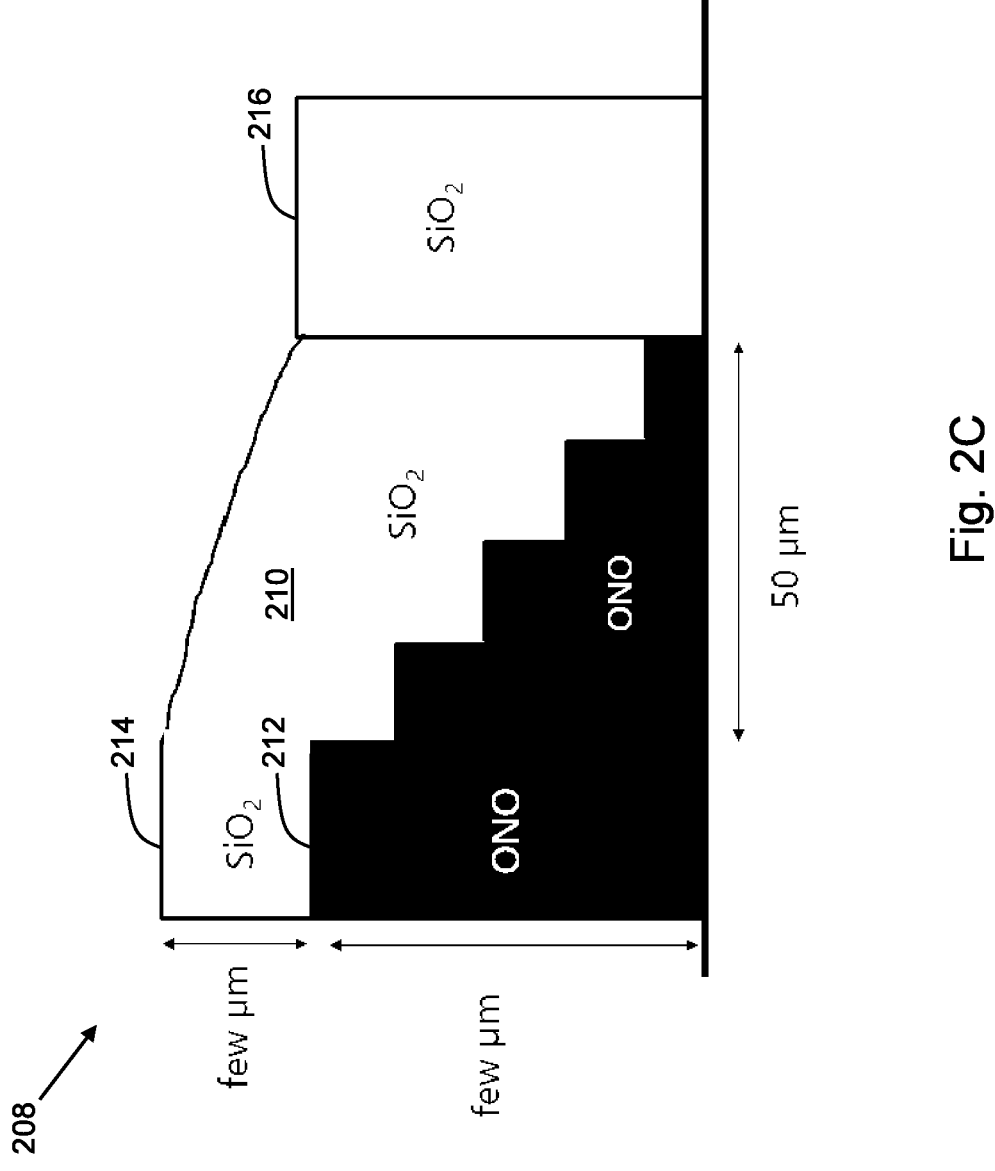

124 and second target location 128 is shown in FIG. 2C which shows a VNAND staircase application in which an ONO (SiO₂/SiN/SiO₂) staircase 208 is shown filled with SiO₂ 210. As chemical-mechanical polishing (CMP) is to be performed to the top of the staircase at 212, the above measurements of first target location 124 and second target location 128 are taken at a first target location 214 and a second target location 216 respectively, where second target location 216 is preferably just above the top of the staircase 212.

Spectrum processing unit 112 creates a first time-domain representation 132 of first wavelength-domain measurement data 126 of light reflected by first target location 124, and a second time-domain representation 134 of second wavelength-domain measurement data 130 of light reflected by second target location 128. If first target location 124 and second target location 128 are of different heights, their reflected light will appear at different time points in their time-domain representations provided the position of the reference mirror is the same when measuring both target locations 124 and 128. Metrology unit 118 is configured to identify a first point in first time-domain representation 132 corresponding to the height of first target location 124, and a second point in second time-domain representation 134 corresponding to the height of second target location 128. Metrology unit 118 then determines the height differential between the height of the first target location and the height of the second target location, which information may be used to control CMP of ONO staircase 208.

In another embodiment shown in FIG. 1D, optical metrology tool 100 is employed as described hereinabove to measure light reflected by patterned structure 102 of semiconductor device 104 and produce corresponding wavelength-domain measurement data 108 from which spectrum processing unit 112 creates time-domain representation 114. A structural anomaly detector 136, which is preferably integrated into optical metrology tool 100, is configured to compare time-domain representation 114 to a reference time-domain representation 138, such as of light reflected by a reference patterned structure, and identify a structural anomaly, such as a void or other structural defect, in semiconductor device 104 if a difference exists between time-domain representations 114 and 138.

Reference is now made to FIG. 3A which is a simplified flowchart illustration of an exemplary method of operation of the system of FIG. 1A, operative in accordance with an embodiment of the invention. In the method of FIG. 3A, an optical metrology tool is employed to measure light reflected by a patterned structure of a semiconductor device and produce corresponding wavelength-domain measurement data that include both spectral amplitude and spectral phase of the reflected light (step 300). A time-domain representation of the wavelength-domain measurement data is created using both the spectral amplitude and the spectral phase of wavelength-domain measurement data (step 302). An earlier-in-time portion of the time-domain representation is selected that excludes a later-in-time portion of the time-domain representation (step 304). Measurements of the patterned structure are determined by performing model-based processing using the selected earlier-in-time portion of the time-domain representation (step 306).

Reference is now made to FIG. 3B which is a simplified flowchart illustration of an exemplary method of operation of the system of FIG. 1B, operative in accordance with an embodiment of the invention. In the method of FIG. 3B, an optical metrology tool is employed to measure light reflected by a patterned structure of a semiconductor device and produce corresponding wavelength-domain measurement data that include both spectral amplitude and spectral phase of the reflected light (step 310). A time-domain representation of the wavelength-domain measurement data is created using both the spectral amplitude and the spectral phase of wavelength-domain measurement data (step 312). An earlier-in-time portion of the time-domain representation is selected that excludes a later-in-time portion of the time-domain representation (step 314). The selected earlier-in-time portion of the time-domain representation is transformed into time-filtered wavelength-domain. measurement data (step 316). Measurements of the patterned structure are determined by performing model-based processing using the time-filtered wavelength-domain measurement data (step 318).

Figure 1C:
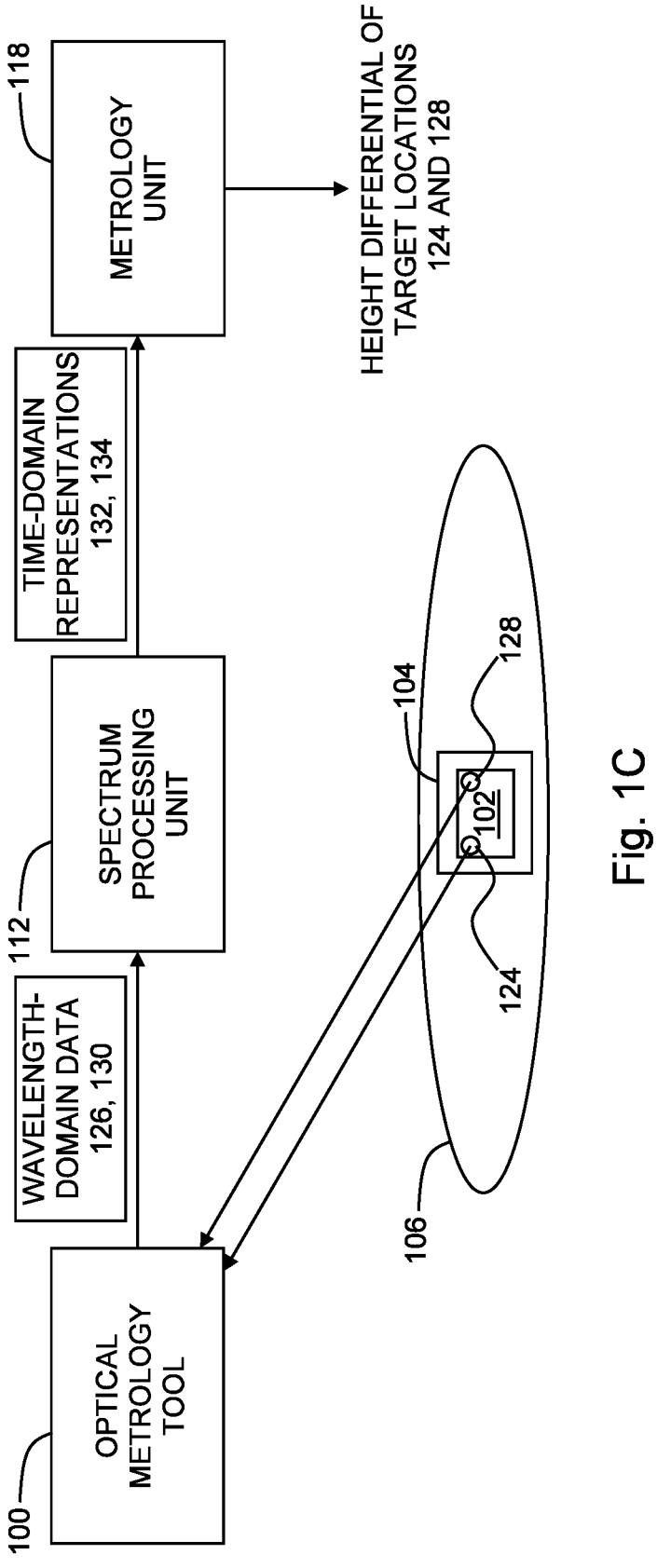

Reference is now made to FIG. 3C which is a simplified flowchart illustration of an exemplary method of operation of the system of FIG. 1C, operative in accordance with an embodiment of the invention. In the method of FIG. 3C, an optical metrology tool is employed to measure light reflected by first and second target locations on a patterned structure of a semiconductor device and produce corresponding first and second wavelength-domain measurement data that include both spectral amplitude and spectral phase of the reflected light (step 320). First and second time-domain representations are created of the first and second wavelength-domain measurement data using both the spectral amplitude and the spectral phase of wavelength-domain measurement data (step 322). A first point in the first time-domain representation and a second point in the second time-domain representation are identified corresponding to the heights of the first and second target locations (step 324). The height differential between the height of the first target location and the height of the second target location is then determined (step 326).

Figure 1D:
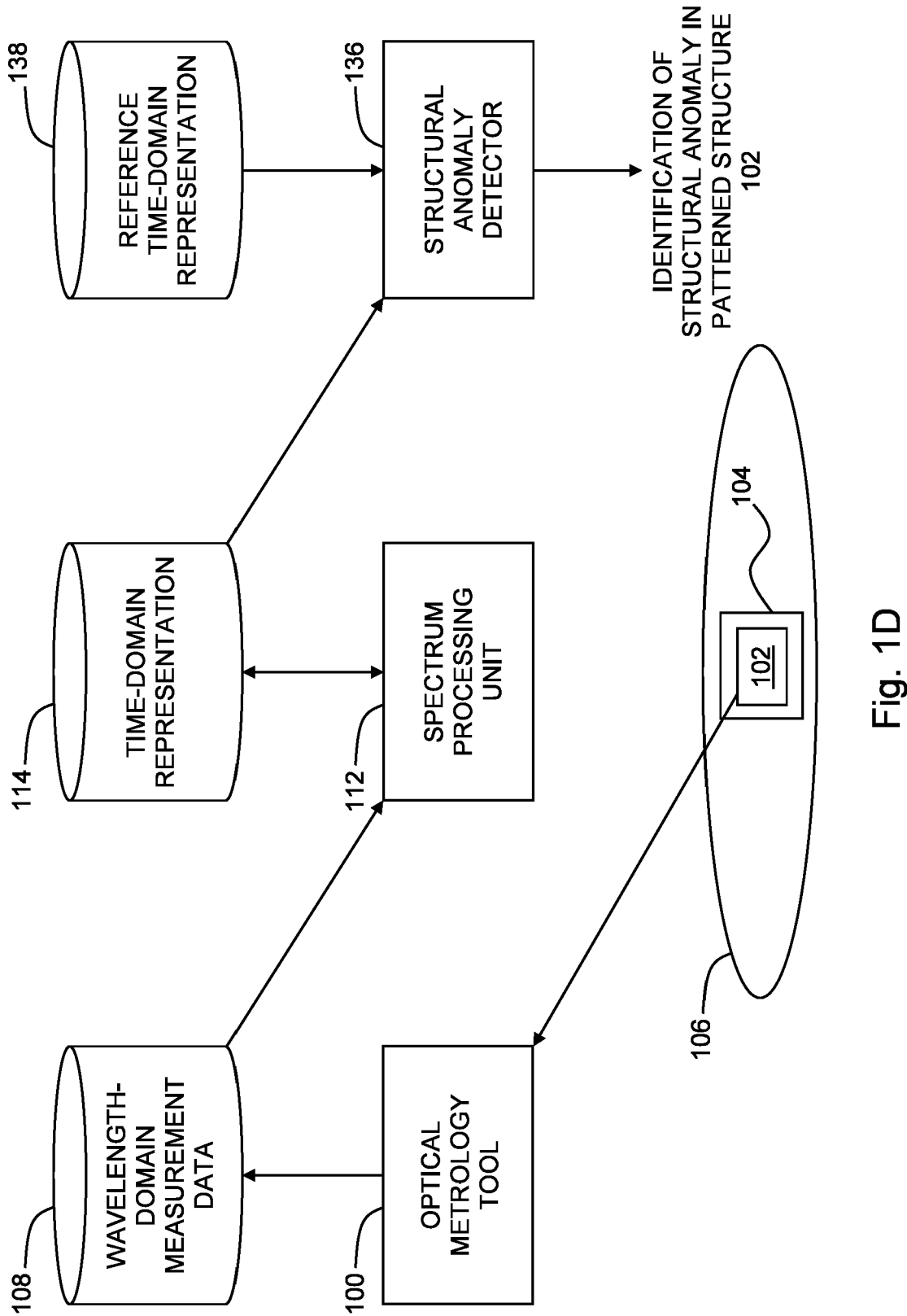

Reference is now made to FIG. 3D which is a simplified flowchart illustration of an exemplary method of operation of the system of FIG. 1D, operative in accordance with an embodiment of the invention. In the method of FIG. 3D, an optical metrology tool is employed to measure light reflected by a patterned structure of a semiconductor device and produce corresponding wavelength-domain measurement data that include both spectral amplitude and spectral phase of the reflected light (step 330). A time-domain representation of the wavelength-domain measurement data is created using both the spectral amplitude and the spectral phase of wavelength-domain measurement data (step 332). The time-domain representation is compared to a reference time-domain representation (step 334). If a difference exists between the time-domain representations (step 336), a structural anomaly is identified in the semiconductor device (step 338).

Optical Critical Dimensions (OCD) metrology is a mainstream approach for dimensional characterization of semiconductor devices during the fabrication process.

OCD is based on optical scatterometry—high-quality measurements of the optical reflectivity properties of the measured pattern at different conditions (wavelengths, polarizations, angles of incidence etc.) and interpretation of the reflectivity information using advance algorithms, modeling and machine-learning methods.

A critical complication in using OCD methods is also one of its key strengths: light penetrates and interacts deep into the measured structure, providing sensitivity to dimensions and materials throughout the stack. As modern SC structures are extremely thin, light typically penetrates deep into multiple layers of the patterned structure, and is affected by dimensional and material characteristics from all these regions. It is often extremely difficult to separate between sensitivity to different parts of the measured structure.

There are several implications of such sensitivity—including (a) Model setup complexity and time-to-solution, (b) Sensitivity to multitude of parameters and resolution of parameter correlations, (c) Solution robustness, specifically to underlayer variations, (d) OCD for R&D environment, allowing resilience to design changes, (e) ability to use Machine-Learning (ML) solutions, and reduction in number of references, (f) metrology on complex structures and specifically In-die metrology, (g) single recipe for different sites sharing common top-regions, and (h) issues related to short-loop to full-loop solution transfer.

Model setup complexity and time-to-solution (TTS).

a. The first stage in establishing an OCD solution involves setting up an OCD 'recipe'. During this stage, a simulative representation of the measured structure (or some simplified version of it which is similar enough to correctly represent its scattering properties) is established. The simulated structure is then updated and refined based on measured information and reference characteristics, until the simulation correctly represents the key attributes of the measured stack allowing fitting\regression approaches to be used for interpreting the measurements. A key attribute may be an attribute of interest, for example an attribute that significantly affects the signal, and the like. An attribute may be any physical attribute and/or geometrical attribute.

b. For complicated, multi-layered structures, the erection of such simulative representation and its refinement can takes days, and on some cases even weeks. Often, the obtained solution is inaccurate due to the incredibly high complexity involved in these structures, requiring the use of simplifying assumption. Often, this process is requires highly proficient engineers for it to converge to a useful solution.

Sensitivity to multitude of parameters and resolution of parameter correlations a. Complicated structures are commonly described by numerous parameters some of which can be challenging to resolve due to the measured signal's sensitivity to a parameter change (weak parameters).

b. In cases where several parameters are being are assessed, the spectral signature of a change in two or more parameters can be similar. In these cases it is challenging to determine exact values for individual parameters (parameter correlations).

Solution robustness, specifically to underlayer variations.

a. OCD solutions become invalid if used on structures significantly different than those used for their development. Clearly, addition of structural elements (layers, significant shape changes), material changes and even significant dimensional changes render the developed simulative description or machine-learning based description of the stack invalid.

b. OCD's extensive sensitivity means that such a change in any part of the measured stack can cause detrimental degradation of the metrology quality. In this respect, the OCD solution is extremely delicate and various defense mechanisms are commonly used to identify such excursions from its 'validity' domain.

c. In some cases underlayers (or other layers) are non-periodic or do not adhere to other constraints required in order to have an OCD solution. In such cases, even if the underlayer (or other layer) does not contain a parameter-of-interest, the parameters of interest in the desired layer cannot be obtained.

OCD for R&D environment, allowing resilience to design changes.

a. An even more extreme situation exacerbating the previous challenge is raised in R&D environment. During the fabrication process development, frequent design changes are made. Each such change typically renders all associated OCD solutions inapplicable, requiring re-development (or at least adjustment) of the solution so as to apply to the new design.

b. As explained, even when design changes take place at a buried underlayer, metrology solutions for layers above it often must be altered, due to the mentioned extensive sensitivity of these optical methods.

Ability to use Machine-Learning (ML) solutions, and reduction in number of references.

a. Over recent years, ML solutions have increasingly taken an important role in OCD metrology interpretation. In these methods, a set of OCD measurements are taken for samples with accurate reference data (obtained via some other means, e.g. by a different metrology method such as TEM). The ML solution then learns, using this 'training' information, how to interpret measurements from similar structures (either using just the measurements and references, or with additional information from simulation tools).

b. While incredibly strong ML tools have been developed to date, they all inherently require a significant set of 'training' measurements and references. This extensive set is required so that the ML solution learns how to decipher and separate variations of the parameters of interest (POI) and variations from any other parameter in the stack. If a ML solution is used for a stack significantly different from these on which it was taught—e.g. involving variations of parameters which did not vary during the training session—it will commonly fail.

c. Again, OCD's extensive sensitivity creates a significant complication, in that it requires the training dataset to include a very large number of samples, encompassing broad range of dimensional parameter variations. Any ability to limit the sensitivity to specific regions in the stack would drastically reduce the number of reference data points. Moreover, such reduced sensitivity would greatly solidify and stabilize the ML tool, as it will not need to find the mathematical filtering solution for eliminating this sensitivity.

Metrology on complex structures and specifically In-die metrology.

a. Commonly, OCD solutions are used in dedicated areas—often sacrificial regions in the wafer which are not used for eventual functionality (typically in the wafer 'scribe lines'). This allows the measured patterns to be somewhat simplified, allowing reliable OCD solutions and better TTS, and importantly allows the control over what patterns are placed below the measured structure; since these patterns have no functional role, they can be designed so as not to conflict and confound the OCD measurement. Often, underlayers involving a flat metal buffer layer, simple non-patterned layer or simplified pattern are used.

b. In recent years it is increasingly becoming needed to measure OCD on locations that are more representative of the actual process and specifically in-die, meaning—in the functional region of the SC die, on the actual patterns being later used for functional operation. This trend is instigated by the need for metrology closer to the devices of interest, due to increasingly stringent process control requirements. Contrary to scribe-line measurements, these regions are inherently built with underlayers including the complexity dictated by the device design, and these cannot be simplified.

c. The sensitivity of OCD to these underlying structures is often prohibitive, not allowing such in-die metrology operation. This is extremely true when underlayers are non-periodic, in which case model-based OCD solutions are not even possible.

Single recipe for different sites sharing common top-regions.

a. As described, during fabrication the semiconductor stack becomes a multi-layered structure, with different functional elements placed on top of each other. This is specifically typical for multiple metal-interconnect levels, most notably in logic interconnects where 14 such levels and more are becoming typical.

b. Due to the described sensitivity to underlayers, different sites sharing the same top-layer layout but with different underlying structures require separate dedicated OCD solutions. A capability of using one solution for multiple such sites would be of great value, providing both flexibility and generality for the OCD solution. Significant reduction of sensitivity to the underlayers—even if not eliminating this sensitivity altogether—would allow easy recipe transfer between such different sites with minimal adjustments.

Short-loop to full-loop solution transfer.

a. The term 'short-loop' relates to fabrication of a specific layer on bare (or simple) substrate, which at the eventual product resides above underlayers. Using short-loop wafers allow fast cycle time during R&D, providing an important way to optimize fabrication protocols without requiring full fabrication of these underlayers.

b. However, for OCD short loop and full loop stacks typically yield highly different reflectance data, resulting from light interaction with the underlayers. As a result, OCD solutions are commonly developed separately for short-loop and full-loop, requiring significant investment overheads.

It may be beneficial to provide additional manner to select one or more additional manners to select signals related to one or more semiconductor device (SD) portions of interest. The selection may be used for example in various cases—including cases where the mentioned above method is inaccurate.

While reference is made, in various text segments, to layers—but these are merely an example of SD portions. The multiple SD portions may be positioned at different z-axis locations, the multiple SD portions, may include the patterned structure, may include one or more layers, and/or one of more portions that are not layers, two SD portions may be located at the same z-axis locations, and the like.

While reference is made, in various text segments, to one or more upper layers that are relevant SD portions—and one or more lower layers (underlayers) that are irrelevant SD portions—these are merely non-limiting examples of relevant SD portions and irrelevant SD portions.

There is provided a solution that may reduce a measurement sensitivity to underlayers and reducing correlations between the interpreted results and undesired-layer (such as underlayer) properties. The solution can be used to increase sensitivity to weak parameters (weak—has minor affect on the spectrum—depends on the application and the illuminated structural element) and resolve parameter correlations in the general sense.

The solution may increase sensitivity to a relevant semiconductor portion and reduce the sensitivity to an irrelevant semiconductor portion—and thus obliviate or at least reduce using actual semiconductor devices as references—thus reducing the cost of metrology.

The solution may include selecting one or more relevant portions of a time domain representation of wavelength-domain measurement data of light reflected by a patterned structure of a semiconductor device and selecting one or more irrelevant portions.

The measurement data may include reflected spectral amplitude and spectral phase at a broadband wavelength range. Alternatively—the measurement data may include reflected spectral amplitude while the spectral phase may be estimated in any manner.

In the time domain representation—the contributions related to layers of different depth (or different height or different z-axis value) in a semiconductor device are usually located at different times in the time domain representation.

When the measured structure height is of several microns, reflections from its top and bottom regions are well separated in the time domain representation.

However, the challenges solved by the current solution are also applicable to advanced high-end structures which require significantly better vertical (z-axis) resolution, allowing separation of contributions from layers spaced apart by tens of nanometers—and even less than tens of nanometers. At least one of the layers may be a thin layer having a nanometric scale depth.

The method may select one or more relevant portions of the time domain representation ("TD portions") in order to obtain one or more goals—for example reducing sensitivity to attributes of irrelevant semiconductor device ("SD") portions (such as irrelevant underlayers), reducing sensitivity to correlations between one or more relevant SD portions and at least one irrelevant SD portion. Additionally or alternatively—the selection can be made in order to minimize the reduction in sensitivity to one or more attributes of one or more relevant SD portion.

Any tradeoff may be provided between a sensitivity of the solution to one or more attributes of one or more relevant SD portion and a sensitivity of the solution to one or more attributes of at least one irrelevant SD portion.

It should be noted that all techniques detailed below can be implemented separately for each measured feature (and/or can be applied separately to various wavelength ranges of illumination and/or collection). Examples of a measurement feature may include at least one of polarization, angle-of-incidence, angle-of collection, azimuth, and the like.

The selection can be made apply one or more selection criteria that may be obtained in one or more manners.

For example—simulations may be used—for example by applying model-based determination may include using a simulation tool for describing light-matter interaction (such as for example the rigorous coupled-wave analysis (RCWA) of Finite Elements) to calculate the expected reflected fields from a semiconductor device. Multiple simulations are run, providing the reflection spectra (and the corresponding time-domain results) for different dimensional and material characteristics of the semiconductor device (the different dimensional and material characteristics are represented by different reference semiconductor devices). This may also include performing multiple calculations that can be run for various underlayer designs. The outcome of the simulations are evaluated to provide a the one or more selection criteria. The evaluation may include finding a separation that will obtain any of the mentioned above goals.

Yet for another example—the determination may be actual measurement-based. The one or more selection criteria can be identified using a set of semiconductor devices with reference data. For example, the semiconductor device of the set may share relevant upper layers and may differ from each other by their underlayers.

The determination of the one or more selection criteria may be based on simulation and on actual measurements.

The solution may select more than a single relevant TD portion.

Each relevant TD portion may allow separate interpretation of different portions and/or aspects of the semiconductor device. For example—one relevant portion can provide excellent selectivity to a dimensional characteristic placed at the stack top, and enable high-quality metrology for that parameter. One this first parameter is interpreted, a second TD portion is chosen so that sensitivity to attributes placed lower in the semiconductor device—although with slightly increased sensitivity to the underlayer.

Additional can now be interpreted, but with the top SD portion already known from the previous step and injected to the solution, this second interpretation can be made significantly more reliably and robustly.

Another method for selecting a relevant TD portion may be based on the radiation pattern of light that impinges on the semiconductor device.

Assuming that the radiation pattern includes a main lobe and one or more sidelobes—and that a top layer (or a part of the top layer) of the semiconductor device is first illuminated by a certain sidelobe and only afterwards is illuminated by the main lobe. At the detector—when the reflection from the certain sidelobe appears there may be no other reflections from other layers of the semiconductor device. At the detector—at the time the reflection from the main lobe appears—other signals from other layers of the semiconductor may also appear—so that the detector senses a sum of signals from different layers.

Although the reflection from the certain sidelobe is weaker than the reflection from the main lobe—selecting a TD that includes light reflected from ay illuminating the top layer with the sidelobe—and excludes the reflection from the main lobe—can provide information substantially solely from the top layer.

The selection of the one or more relevant TD portions may be followed by filtering signals of irrelevant TD portions—assigning less weight to signals of irrelevant TD portions, and the like.

For example—the time domain cutoff does not need to be a step function but rather a window filter where the contributions outside a the region $t_2 < t < t_1$ are neglected. Such window filters can increase sensitivity to desired attributes of the relevant SD portions and reduce correlations to attributes of irrelevant SD portions.

A multitude of window filters having different widths and/or centers in time domain can be used to enhance parameter sensitivity and resolve parameter correlations.

One or more features of the solution—for example the wavelength domain to time domain conversion itself, and any measurement parameter may be determined in any manner—for example for achieving any of the mentioned above goals.

A choice of the solution features may significantly enhance the vertical resolution, solution robustness, and/or ability to separate between different SD portions.

This determining of the features of the solution can be based on simulation and/or measurement-based. The affect of one or more values of one or more features on the outcome of the solution may be evaluated—and determined to comply with one or more goals of the solution.

The determining of features may include, for example, pre-treatment of the spectrum of emitted light and/or detected light.

Different wavelength ranges in the spectrum may have different penetration depths into the stack and inherently provide some of the desired vertical selectivity. Narrowing of the spectral range used for the analysis can thus be used. Another possibility involves weighting of the spectrum, and specifically applying a filter to the spectral edges (the UV and IR parts) to allow improved performance of the TD transformation.

FIG. 4A is an example of method 400 for semiconductor device metrology.

Method 400 may start by step 410 of creating a time-domain representation of wavelength-domain measurement data of light reflected by a patterned structure of a semiconductor device.

This semiconductor device is also referred to as a measured semiconductor device.

A wavelength-domain to time-domain conversion ("conversion") used during step 410 may be determined in any manner. For example—the conversion may be determined based on penetration depths (within the measured semiconductor device) of different wavelength components of the light.

The different penetration depths may be used to determine which wavelengths penetrate each portion of the semiconductor device. When, for example, a certain wavelength penetrates only a relevant portion—it may be beneficial to use this certain wavelength. The penetration depths of the different wavelengths may be used for removing wavelengths (from the light that impinges on the evaluated semiconductor device) and/or for applying weights (or otherwise increasing or decreasing the importance of) different wavelengths of the wavelength-domain measurement data.

Method 400 may also include step 430 of receiving and/or determining one or more selection criteria to be used during step 420.

Steps 410 and 430 may be followed by step 420.

Step 420 may include selecting one or more relevant TD portions and at least one irrelevant TD portion.

The selecting of the one or more relevant TD portions may include applying one or more selection criteria. The one or more selection criteria may be one or more rules, or may be applied by using a machine learning process, a neural network, and the like.

The z-axis propagates along a depth of the semiconductor device. For example—different layers may be located at different z-axis coordinates.

Step 420 may include selecting any number of relevant TD portions.

Step 420 may include or may be preceded by obtaining (step 430) one or more selection criteria to be applied for selecting the one or more relevant TD portions.

The selection made during step 420 may be based, at least in part, on one or more of the following:

a. Z-axis location of at least one relevant SD portion of the multiple SD portions within the semiconductor device. For example—the method may receive one or more z-axis locations of one or more relevant SD portions and perform the selection accordingly. For example— in previous examples a cutoff based selection was made for selecting one or more upper layer of the SD and ignoring one or more lower layers of the SD.

b. One or more attributes of one or more SD portions device.

c. A sensitivity of method 400 to one or more attributes of one or more DS portions.

d. At least one parameter of the one or more parameters of interest.

e. At least one measurement condition—that may be an illumination condition and/or collection condition—for example polarization, The selection made during step 420 may include applying one or more selection criteria. A selection criteria can be determined in any manner—for example—based on simulation, based on actual measurements, and the like.

The attributes may be received by method 400 or determined in any manner—for example simulation, based on real measurements, and the like.

Step 420 may be followed by step 490 of determining one or more measurements of one or more parameters of interest of the patterned structure by performing processing using the one or more relevant TD portions.

The signals included in one or more irrelevant TD portions may be ignored of. Alternatively—they may be taken into account but given less significance that the signals of the one or more relevant TD portions.

FIG. 4B is an example of method 401 for semiconductor device metrology.

Method 401 differs from method 400 by including step 411 of receiving additional information. The additional information may be, for example, measurements of the semiconductor device, that are not executed by applying steps 410 and the like.

Step 411 and step 420 are followed by step 492 of determining one or more measurements of one or more parameters of interest of the patterned structure by performing processing using the one or more relevant portions of the time-domain representation and using the additional information.

FIG. 4C illustrates an example of step 430 of method 400.

Step 430 may include step 450 of determining the one or more selection criteria based on a simulation of a metrology of one or more references semiconductor devices.

The simulation may be of references semiconductor devices that may differ from each other—for example—by one or more attributes of one or more SD portions (for example irrelevant SD portions).

The different references semiconductor devices may determining by introducing changes (at least in one or more irrelevant SD portions) in a model of the measured semiconductor device.

The changes may include, for example, changing a material of at least one SD portion, changing at least one of shape and size of one or more elements of at least one SD portion, changing a location of at least one SD portion, omitting one or more elements, adding one or more elements, and the like.

By simulating different attributes—the simulation may find the sensitivity of method 400 to one or more attributes of one or more SD portions.

Step 450 may include simulating the metrology by at least one out of (a) simulating (step 452) different parameters of interest to be measured during step 490, and (b) simulating (step 454) of different values of at least one measurement condition. A measurement condition may be an illumination condition, a collection condition or a combination thereof.

Step 452 and/or step 454 may be applied when simulating one or more reference semiconductor devices.

Any reference semiconductor device may differ from the measured semiconductor device in one or more aspect—but may be similar in at least one other aspect. For example—the one or more relevant SD portions may remain the same while one or more differences may be introduced in the one or more irrelevant SD portions.

Step 430 may include step 460 of determining the one or more selection criteria based on metrology measurements of different reference semiconductor devices that differ from each other by at least one attribute of at least one irrelevant SD portion. The different reference semiconductors devices may include at least a portion of the patterned structure of the measured semiconductor device.

Step 430 may include step 470 of determining the one or more selection criteria based on actual or estimated metrology measurements of different reference semiconductor devices that differ from each other by at least one attribute of at least one irrelevant SD portion.

The different reference semiconductor devices may include a short loop semiconductor device and a long loop semiconductor device. Both short loop semiconductor device and long loop semiconductor device may include at least a portion of the patterned structure of the measured semiconductor device. The short loop semiconductor device may consist essentially of (a) at least a portion of the patterned structure of the semiconductor device and a substrate. The long loop semiconductor device may include substantially the entire portions of the measured semiconductor device.

Step 440 may include step 480 of determining the one or more selection criteria based on actual or estimated reflection of different lobes of radiation from a semiconductor device.

The lobes may be simulated lobes of radiation or actual lobes of radiation. The light reflected by the patterned structure of the semiconductor device may include the different lobes.

For example—step 480 may include determining a selection criteria for selecting a relevant TD portion that includes measurement data of a reflection of a light sidelobe from at least a portion of a patterned structure of the semiconductor device.

The light sidelobe impinges on the at least portion of the patterned structure of the semiconductor device prior to an impingement of a main lobe of the light on the at least portion of the patterned structure of the semiconductor device.

The selection criteria may include ignoring measurement data of the main lobe reflected by the patterned structure of the semiconductor device.

FIG. 5 illustrates a method 500 for comparing between measured semiconductor devices.

Method 500 may include steps 510, 520 and 530.

Step 510 may include obtaining one or more measurements of one or more parameters of interest of a patterned structure of a first measured semiconductor device. The one or more measurements of one or more parameters of interest are generated using either one of method 400 and 401.

Step 520 may include obtaining one or more measurements of one or more parameters of interest of a patterned structure of a second measured semiconductor device. The one or more measurements of one or more parameters of interest are generated using either one of method 400 and 401.

Steps 510 and 520 may be followed by step 530 of comparing (a) the one or more measurements of the one or more parameters of interest of the patterned structure of the first semiconductor device to (b) the one or more measurements of the one or more parameters of interest of the patterned structure of the second semiconductor device. The comparing provides one or more comparison result.

The comparison can be made between more than one or more measurements of the one or more parameters of interest of a patterned structure of more than two semiconductor devices.

The comparison result may be processed to determine, for example, differences between the semiconductor devices, to indicate of a potential defect or failure, to indicate of process variation, and the like.

Figure 6:
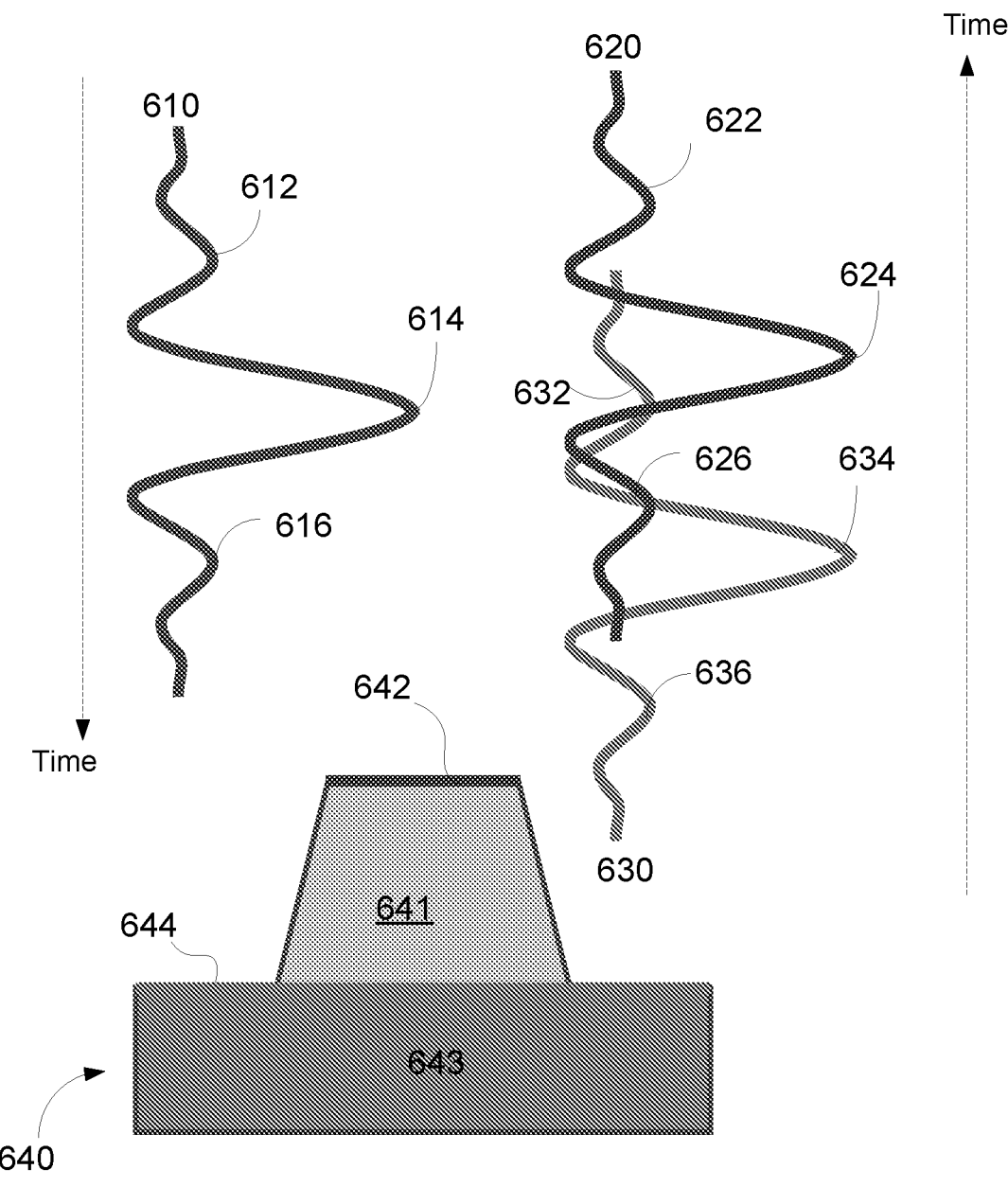
FIG. 6 illustrates an example of a patterned structure, illuminating and reflected radiation.

FIG. 6 illustrates an example of a patterned structure 460 of a semiconductor device, impinging radiation 610, first reflected radiation 620 reflected from a top surface 642 (and top layer 641) of patterned structure 460, and second reflected radiation 630 reflected from a lower surface 644 (and lower layer 643).

The impinging radiation 610 has an early impinging sidelobe 616, an impinging main lobe 614 and a late impinging sidelobe 612. The first reflected radiation 620 has an early first sidelobe 622, a first main lobe 624 and a late first sidelobe 626. The second reflected radiation 630 has an early second sidelobe 632, a second main lobe 634 and a late second sidelobe 636.

There is no timing overlap between the early first sidelobe 622 and the second reflected radiation 630—while there is a timing overlap between the first main lobe 624 and the second reflected radiation 630 (especially an overlap between the first main lobe 624 and the early second sidelobe 632). Due to the absence of overlap—the early first sidelobe 622 may provide reliable information about the top surface (and the top layer 641).

Its should be noted that due to the same reasons—the late second sidelobe 636 may provide reliable information about the lower surface 644 (and the lower layer 643).

Assuming that the radiation pattern includes a main lobe and one or more sidelobes—and that a top layer (or a part of the top layer) of the semiconductor device is first illuminated by a certain sidelobe and only afterwards is illuminated by the main lobe. At the detector—when the reflection from the certain sidelobe appears there may be no other reflections from other layers of the semiconductor device. At the detector—at the time the reflection from the main lobe appears—other signals from other layers of the semiconductor may also appear—so that the detector senses a sum of signals from different layers.

Although the reflection from the certain sidelobe is weaker than the reflection from the main lobe—selecting a TD that includes light reflected from ay illuminating the top layer with the sidelobe—and excludes the reflection from the main lobe—can provide information substantially solely from the top layer.

Frequency Expansion

There may be provided a significant improvement in methods using time-domain (TD) approach for metrology. Specifically, methods as described above use measurements of broadband field reflectivity (i.e. complex reflectivity) to deduce the time-domain impulse response (TDIR) of the structure.

Different parts of the TDIR relate to reflections taking place at different times, allowing their association to reflections from different regions in the measured stack.

Such methods allow reduced sensitivity to underlayers and improved metrology for the regions of interest.

One attribute of these methods is the obtained vertical resolution. Generally, the vertical resolution $\Delta L$ is dictated by the spectral bandwidth, and (to a rough approximation) can be estimated by $$\Delta L = \frac{1}{\frac{n_{eff}}{\lambda_{min}} - \frac{n_{eff}}{\lambda_{max}}},$$

With $n_{eff}$ some effective refractive index associated with the structure, $\lambda_{min}$ and $\lambda_{max}$ the minimal and maximal wavelengths. Different methods can be employed to estimate $n_{eff}$.

Regions in the stack with vertical separation smaller than $\Delta L$ cannot be readily separated using TD methods, greatly limiting their applicability. With standard scatterometry employing UV-IR spectral range, once can deduce that typical vertical separation is many tens of or even few hundred of nm, meaning that the thickness of many of today's high-end semiconductor structures are below the access of TD methods.

The suggested solution addresses vertical limitation, and offers an algorithmic way to improve the resulting resolution beyond the theoretical limit given above.

As described, the resolution limitations of TD methods is dictated by the measurement spectral bandwidth (Eq. 1). The current solution may extend the measured spectrum with an artificial extrapolation, which—while not providing any additional insight on the measured structure—will provide improved TD (vertical) resolution.

There is a need to provide an accurate extrapolation to prevent erroneous spectral extensions that could lead to a faildown of the entire TD method—eventually causing more harm than benefit.

It should be noted that while spectral extrapolation to both UV and IR range is advantageous, it is significantly more important to extend the spectrum into the UV, as the expected resolution improvement will be appreciably more notable (see Eq. 1).

There are several methods to obtain such a spectral extrapolation may include Model-based extrapolation, Reference-based extrapolation, and Physical-arguments based extrapolation:

The Model-based extrapolation may include one or more methods that may use the fact that in most cases, the measured structure will be a periodic array of elements of (roughly) known geometry, to which a model-based reflectivity spectrum can be deduced using a light-matter simulation.

Using nominal stack description, one can extend the simulated spectra to wavelengths beyond the measured range and append the results to the measured datasets. Extending the model to wavelengths beyond the measured bandwidth is straightforward (just requires information on the optical properties of the stack materials in these wavelengths, which are often available or can be obtained from physical considerations).

A naive implementation of this approach would cause discontinuities between the simulated and measured spectra. A smoothing algorithm—by which the extrapolated spectrum is modified such that it continuously extends the measured spectrum (or even the measured spectrum and its local derivative) can be implemented to avoid such unrealistic extensions.

One could refine the model used for this extension using the measurement itself: run a preliminary interpretation which provides rough characterization of the stack and use the derived dimensions as basis for the model-based extrapolation. Clearly, this first step will suffer from 'contamination' from the underlayers, but as it is only needed to be approximate induced errors may be limited.

It is also possible to do so recursively: a preliminary guess for some stack description is first used for calculation of the spectral extensions and appended to the measurement. At each point along the interpretation regression process (meaning: stack parameters are altered and calculation results compared to measurement), the spectrum is simulated at a very broad spectral range. The spectral parts beyond the measured range are appended to the measurement. Now both simulated and measured spectra (with the measured spectrum extended by the simulation) go through VTS and compared. This approach may provide improved results.

Reference-based extrapolation—Here, a single extrapolation is used for all measurements (as in the first case above—'using nominal stack'). However, the choice of this nominal is done during recipe creation stage: a large set of such 'nominal' stacks are calculated and used for analyzing a set of samples with references. The chosen nominal which provides best results may be used hereafter for extrapolation.

References here can mean actual dimensional values. Possibly simpler would be to have different samples or even sites on the same wafer, when only underlayers were intentionally altered (e.g. short\full-loop). These too can serve as 'reference' (even without external dimensional metrology), such that the 'best spectrum' for extrapolation is chosen so as to provide most similar results to all samples with the same underlayers (i.e. best underlayer-independence).

Physical-arguments based extrapolation—It can be shown that field reflectivity has to satisfy some specific properties. One such requirement is that the real and imaginary parts of the reflected field satisfy Kramers-Kronig (KK) relations. These integral relations impose restrictions on the extrapolated spectra, based on the data known from the measured domain. After obtaining any extrapolation approximation (by any of the methods above or other), one can correct the extrapolation using KK relations, reducing the overall extrapolation errors.

These KK relations can also be used without any additional input for spectral extrapolation: by projecting the measured dataset onto a basis function set satisfying the KK relations, extrapolation can be trivially obtained (as described in detail in A. B. Kuzmenko, 'Kramers-Kronig Constrained Variational Analysis of Optical Spectra', Review of Scientific Instruments 76, 083108 (2005)).

Specifically when extrapolating to the 'long-wavelength' domain, some stacks can be treated by approximation description; in mid-IR, 'effective medium' or other simplified approaches can be highly accurate, while not requiring detailed description of the stack. By this approach, we use the inherent low sensitivity of MIR as a means to get high-accuracy spectral extrapolation.

As described above, an extended spectral range would lead to improved vertical resolution in the TD analysis, allowing superior ability to separate contributions from different parts of the stack. As extensively described in [reference to our previous IPs], such improvement could lead to a large set of benefits—in overall metrology performance, its resilience to process variations and even its applicability to patterns with varying underlayers using a single solution scheme.

One example of specific interest is the use of TD methods for 3D-NAND metrology. Here, the overall stack height is of several microns, so there is no resolution challenge in separating reflections from the stack top and from the bottom of the 3D-NAND structure. However, if one is interested in separating reflections from the 3D-NAND structure bottom and from CMOS structures positioned below it, the required vertical resolution can be significantly better.

The method described here can enable this ability.

Any aspect, described herein may be implemented in computer hardware and/or computer software embodied in a non-transitory, computer-readable medium in accordance with conventional techniques, the computer hardware including one or more computer processors, computer memories, I/O devices, and network interfaces that interoperate in accordance with conventional techniques.

It is to be appreciated that the term "processor" or "device" as used herein is intended to include any processing device, such as, for example, one that includes a CPU (central processing unit) and/or other processing circuitry. It is also to be understood that the term "processor" or "device" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc. Such memory may be considered a computer readable storage medium.

In addition, the phrase "input/output devices" or "I/O devices" as used herein is intended to include, for example, one or more input devices (e.g., keyboard, mouse, scanner, etc.) for entering data to the processing unit, and/or one or more output devices (e.g., speaker, display, printer, etc.) for presenting results associated with the processing unit.

Embodiments of the invention may include a system, a method, and/or a computer program product. The computer program product may include a computer readable storage medium (or media) having computer readable program instructions thereon for causing a processor to carry out aspects of the invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages.

The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the invention.

Aspects, are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart illustrations and block diagrams in the drawing figures illustrate the architecture, functionality, and operation of possible implementations of systems, methods, and computer program products according to various embodiments of the invention. In this regard, each block in the flowchart illustrations or block diagrams may represent a module, segment, or portion of computer instructions, which comprises one or more executable computer instructions for implementing the specified logical function(s). In some alternative implementations, the functions noted in a block may occur out of the order noted in the drawing figures. For example, two blocks shown in succession may, in fact, be executed substantially concurrently, or the blocks may sometimes be executed in the reverse order, depending upon the functionality involved. It will also be noted that each block of the flowchart illustrations and block diagrams, and combinations of such blocks, can be implemented by special-purpose hardware-based and/or software-based systems that perform the specified functions or acts.

The descriptions of the various embodiments of the invention have been presented for purposes of illustration, but are not intended to be exhaustive or limited to the embodiments disclosed. For example, the systems and methods described herein are applicable to any type of structure on semiconductor wafers. Many modifications and variations will be apparent to those of ordinary skill in the art without departing from the scope and spirit of the described embodiments.

We claim:

1. A method for semiconductor device metrology, the method comprising:

creating a time-domain representation of wavelength-domain measurement data of light reflected by a patterned structure of a semiconductor device; wherein the semiconductor device comprises multiple semiconductor device portions that are positioned at different z-axis locations, the multiple semiconductor device portions comprise the patterned structure;

selecting one or more relevant portions of time-domain representation and at least one irrelevant portion of the time domain representation; wherein the selecting is based, at least in part, on a sensitivity of the method to at least one attribute of at least one semiconductor device portion of the multiple semiconductor device portion;

determining one or more measurements of one or more parameters of interest of the patterned structure by performing processing using the one or more relevant portions of the time-domain representation.

2. The method according to claim 1 wherein the selecting is made to reduce sensitivity to correlations between one or more relevant semiconductor portions and at least one irrelevant semiconductor portion.

3. The method according to claim 1, wherein the selecting is made to provide a defined tradeoff between a sensitivity to one or more attributes of one or more relevant semiconductor device portions and a sensitivity of the solution to one or more attributes of at least one irrelevant semiconductor device portion.

4. The method according to claim 1, wherein the selecting is made for a illumination wavelength range and another selecting is made for a different illumination wavelength range.

5. The method according to claim 1, wherein the selecting is made for a collection wavelength range and another selecting is made for a different collection wavelength range.

6. The method according to claim 1, comprising obtaining one or more selecting criteria, wherein the selecting comprises applying the one or more selecting criteria.

7. The method according to claim 6 wherein the obtaining comprises determining the one or more selecting criteria.

8. The method according to claim 1 wherein the determining of the one or more measurements of the one or more parameters of interest of the patterned structure is also responsive to additional information.

9. The method according to claim 1 comprising obtaining one or more measurements of one or more parameters of interest of a patterned structure of an other semiconductor device, and comparing (a) the one or more measurements of the one or more parameters of interest of the patterned structure of the other semiconductor device to (b) the one or more measurements of the one or more parameters of interest of the patterned structure of the semiconductor device.

10. The method according to claim 1, further comprising adjusting one or more parameters of an optical metrology tool based on the determined measurements.

11. A non-transitory computer readable medium that stores instructions for:

creating a time-domain representation of wavelength-domain measurement data of light reflected by a patterned structure of a semiconductor device; wherein the semiconductor device comprises multiple semiconductor device portions that are positioned at different z-axis locations, the multiple semiconductor device portions comprise the patterned structure;

selecting one or more relevant portions of time-domain representation and at least one irrelevant portion of the time domain representation; wherein the selecting is based, at least in part, on a sensitivity of the instructions to at least one attribute of at least one semiconductor device portion of the multiple semiconductor device portion; and determining one or more measurements of one or more parameters of interest of the patterned structure by performing processing using the one or more relevant portions of the time-domain representation; and adjusting one or more parameters of an optical metrology tool based on the determined measurements.

12. The non-transitory computer readable medium according to claim 11, wherein the selecting is made to reduce sensitivity to correlations between one or more relevant semiconductor portions and at least one irrelevant semiconductor portion.

13. The non-transitory computer readable medium according to claim 11, that further stored instructions for adjusting one or more parameters of an optical metrology tool based on the determined measurements.

* * * * *